(12) United States Patent
Miura et al.

(10) Patent No.: US 11,131,023 B2
(45) Date of Patent: Sep. 28, 2021

(54) FILM DEPOSITION APPARATUS AND FILM DEPOSITION METHOD

(71) Applicant: Tokyo Electron Limited, Tokyo (JP)

(72) Inventors: Shigehiro Miura, Yamanashi (JP); Jun Sato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 93 days.

(21) Appl. No.: 15/806,681

(22) Filed: Nov. 8, 2017

(65) Prior Publication Data

US 2018/0135178 A1 May 17, 2018

(30) Foreign Application Priority Data

Nov. 11, 2016 (JP) .............................. JP2016-220589

(51) Int. Cl.
| | | |
|---|---|---|
| *H01L 21/00* | (2006.01) | |
| *C23C 16/455* | (2006.01) | |
| *C23C 16/40* | (2006.01) | |
| *C23C 16/507* | (2006.01) | |
| *C23C 16/24* | (2006.01) | |

(Continued)

(52) U.S. Cl.
CPC ........ *C23C 16/45565* (2013.01); *C23C 16/24* (2013.01); *C23C 16/401* (2013.01); *C23C 16/45544* (2013.01); *C23C 16/45551* (2013.01); *C23C 16/45574* (2013.01); *C23C 16/45578* (2013.01); *C23C 16/507* (2013.01); *H01L 21/0217* (2013.01); *H01L 21/02186* (2013.01); *H01L 21/68764* (2013.01);
(Continued)

(58) Field of Classification Search
CPC . C23C 16/45565; C23C 16/24; C23C 16/401; C23C 16/45544; C23C 16/45551; C23C 16/45574; C23C 16/45578; C23C 16/507; H01L 21/0217; H01L 21/02186; H01L 21/0228; H01L 21/68764
See application file for complete search history.

(56) References Cited

U.S. PATENT DOCUMENTS

| 2013/0164942 A1* | 6/2013 | Kato | ...................... H01L 21/30 |
| | | | 438/758 |
| 2015/0225849 A1* | 8/2015 | Kato | ................. C23C 16/45551 |
| | | | 438/793 |

FOREIGN PATENT DOCUMENTS

| JP | 2001-254181 | 9/2001 |
| JP | 2013-503971 | 2/2013 |
(Continued)

*Primary Examiner* — Mounir S Amer
*Assistant Examiner* — Alexander Belousov
(74) *Attorney, Agent, or Firm* — IPUSA, PLLC

(57) ABSTRACT

A film deposition apparatus includes a process chamber and a turntable provided in the process chamber. The turntable includes a substrate receiving region to receive a substrate thereon and provided along a circumferential direction of the turntable. A source gas supply unit extending along a radial direction of the turntable is provided above the turntable with a first distance from the turntable such that the source gas supply unit covers an entire length of the substrate receiving region in the radial direction. An axial-side supplementary gas supply unit is provided in the vicinity of the source gas supply unit and above the turntable with a second distance from the turntable. The second distance is longer than the first distance. The axial-side supplementary gas supply unit covers a predetermined region of the substrate receiving region on the axial side in the radial direction of the turntable.

7 Claims, 21 Drawing Sheets

(51) Int. Cl.
*H01L 21/02* (2006.01)
*H01L 21/687* (2006.01)
(52) U.S. Cl.
CPC .... *H01L 21/0228* (2013.01); *H01L 21/02164* (2013.01); *H01L 21/02211* (2013.01); *H01L 21/02219* (2013.01)

(56) References Cited

FOREIGN PATENT DOCUMENTS

| JP | 2013-045903 | 3/2013 |
| JP | 2013-162154 | 8/2013 |
| JP | 2015-220293 | 12/2015 |
| KR | 10-2010-0103416 | 9/2010 |

\* cited by examiner

FILM DEPOSITION APPARATUS AND FILM DEPOSITION METHOD

CROSS-REFERENCE TO RELATED APPLICATION

The present application is based on Japanese Priority Application No. 2016-220589 filed on Nov. 11, 2016, the entire contents of which are hereby incorporated herein by reference.

BACKGROUND OF THE INVENTION

1. Field of the Invention

The present invention relates to a film deposition apparatus and film deposition method.

2. Description of the Related Art

Conventionally, as disclosed in Japanese Laid-Open Patent Application Publication No. 2013-45903, ALD (Atomic Layer Deposition) that deposits a reaction product on a surface of a wafer by supplying a plurality of kinds of process gases (reaction gases) that react with each other to the surface of the wafer, is known as one of methods of depositing a thin film such as a silicon oxide ($SiO_2$) film on a substrate such as a semiconductor wafer. ALD film deposition apparatuses include a turntable type ALD film deposition apparatus that performs ALD film deposition by rotating a turntable. For example, a film deposition apparatus disclosed in Japanese Laid-Open Patent Application Publication No. 2013-45903 includes a turntable on which five or six wafers are to be arranged along a circumferential direction of the turntable, a source gas supply part for supplying a source gas, and an antenna for converting a gas to plasma that are sequentially arranged above a path through which the wafers pass by rotating the turntable.

When depositing a high-quality $SiO_2$ film using the ALD film deposition apparatus disclosed in Japanese Laid-Open Patent Application Publication No. 2013-45903, there is a method of supplying a Si-containing gas such as 3DMAS (Tris(dimethylamino)silane) or an organic aminosilane gas in a source gas supply region, supplying an oxidation gas such as $O_3$ in an oxidation gas supply region, and supplying plasma of a mixed gas of oxygen and hydrogen in a treatment region, respectively, while rotating the turntable at high speed to cause the wafers to pass the three gas supply regions at high speed, thereby depositing a high-quality $SiO_2$ film. According to the method, a layer of Si source adsorbed on the wafer in the source gas supply region is treated by the plasma in the treatment region after being oxidized in the oxidation gas supply region, and then the Si source is adsorbed again in the source gas supply region. Thus, uniform film deposition across a surface of the wafer can be readily achieved by continuously repeating the steps of film deposition and treatment.

However, along with miniaturization of circuit patterns, for example, as aspect ratios of trenches in trench isolation structures or spaces in line/space patterns become greater, filing trenches or spaces with films becomes more difficult even in the ALD method.

For example, when filling a space having a width of about 30 nm with a silicon oxide film, the film thickness is likely to become thick at around the upper end of a side wall defining the space and likely to become thin on the bottom side of the space. Hence, the silicon oxide film filled into the space sometimes includes a void. When such a silicon oxide film is etched in the following etching process, for example, an opening in communication with the void is sometimes formed in an upper surface of the silicon oxide film. This opening is liable to allow an etching gas (or etching solution) to go into the void to contaminate the silicon oxide film, or to allow metal to go into the void to generate a defect in the silicon oxide film in the following metallization process.

Such a problem can be caused in not only ALD but also CVD (Chemical Vapor Deposition). For example, when forming a contact hole (so-called a "plug") by filling a through-hole formed in a semiconductor substrate with a conductive material, a void may be formed in the plug. Therefore, to reduce the generation of void, Japanese Laid-Open Patent Application Publication No. 2013-162154 proposes a method for depositing a $SiO_2$ film in which OH groups are adsorbed on a silicon oxide film produced by oxidizing an organic aminosilane gas, and then the silicon oxide film is exposed to oxygen plasma to reduce the number of OH groups around the opening of the trench and to leave the OH groups on and around the bottom. The OH groups serve as an adsorption site for the organic aminosilane gas, and the organic aminosilane adsorbs on the OH groups depending on the distribution of the OH groups. Hence, the organic aminosilane gas adsorbs much on and around the bottom, and less adsorbs around the opening of the trench than the bottom. Thus, the silicon oxide film is deposited thick on and around the bottom of the trench, and becomes thinner with the decreasing distance from the opening of the trench. For example, the trench having a high aspect ratio in a circuit pattern is filled with the film from the bottom without generating a void by using such a film deposition technique.

However, the film deposition method that controls the OH group distribution using the plasma and thereby controls the amount of adsorption of the organic aminosilane gas is often more difficult to achieve preferable uniformity across the wafer than a film deposition method that adsorbs a layer of source gas, oxidizes the layer of source gas, and then treat the oxidized source gas. In other words, in the method of controlling the OH group distribution by a plasma source using the turntable type ALD film deposition apparatus, the oxidation plasma is much supplied to the axial side, but is less supplied to the periphery than the axial side because an angular rate on the axial side differs from the peripheral side because of the difference in radius. Thus, fewer OH groups are present on the axial side, whereas more OH groups are present on the peripheral side, which causes the organic aminosilane gas adsorbs on the peripheral side more than the axial side. As a result, the film thickness on the peripheral side is thicker than that of the axial side.

To correct the unevenness of the plasma supply between the axial side and the peripheral side of the turntable, Japanese Laid-Open Patent Application Publication No. 2015-220293 proposes an ALD apparatus that includes two independent nozzles for supplying plasma gases to the axial side and the peripheral side of a turntable, respectively, in addition to a nozzle for supplying a plasma gas to the entire radius of the turntable. The ALD apparatus disclosed in Japanese Laid-Open Patent Application Publication No. 2015-220293 can regionally increase a supply of the plasma gas to the peripheral area, thereby improving the uniformity of the plasma treatment across the wafer.

However, only the correction of the unevenness across the wafer using the plasma in the treatment region is sometimes insufficient. For example, when a low flow rate process for mass production is required, uniformity of the source gas supply across the wafer is unlikely to be achieved because a purge gas supplied to the axial region of the turntable may affect the source gas supply when the flow rate of the source gas is set at the low flow rate for mass production.

SUMMARY OF THE INVENTION

The present invention is made in light of the above problems, and provides a film deposition apparatus and film deposition method that can improve uniformity of source gas supply across a surface of a substrate.

According to an embodiment, there is provided a film deposition apparatus that includes a process chamber and a turntable provided in the process chamber. The turntable includes a substrate receiving region to receive a substrate thereon and provided along a circumferential direction of the turntable. A source gas supply unit extending along a radial direction of the turntable is provided above the turntable with a first distance from the turntable such that the source gas supply unit covers an entire length of the substrate receiving region in the radial direction. An axial-side supplementary gas supply unit is provided in the vicinity of the source gas supply unit and above the turntable with a second distance from the turntable. The second distance is longer than the first distance. The axial-side supplementary gas supply unit covers a predetermined region of the substrate receiving region on the axial side in the radial direction of the turntable.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Embodiments of the present invention are described below with reference to accompanying drawings.

[Film Deposition Apparatus]

Figure 1:
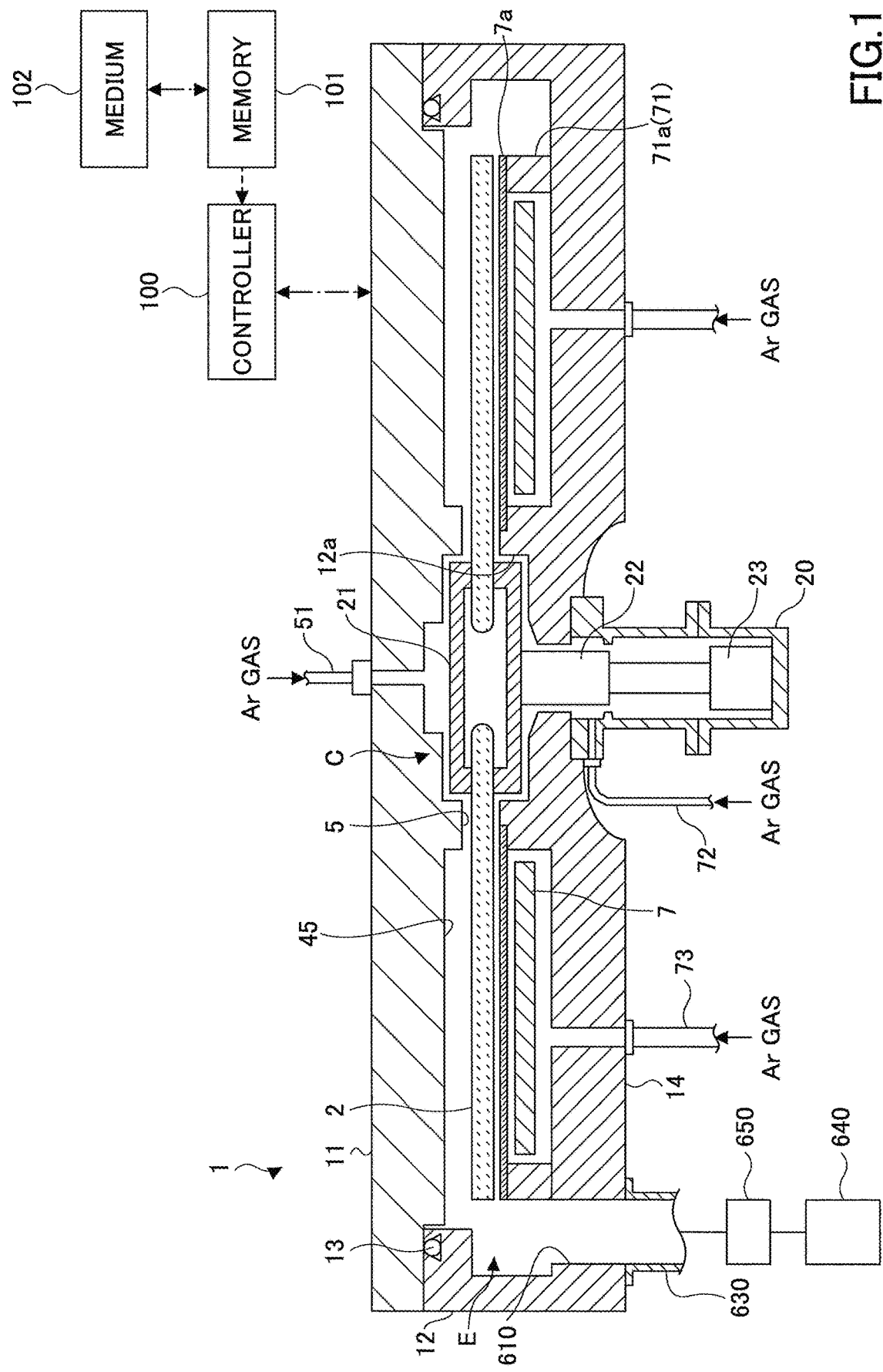
FIG. 1 a schematic cross-sectional view illustrating an example of a film deposition apparatus according to an embodiment of the present disclosure.
Figure 2:
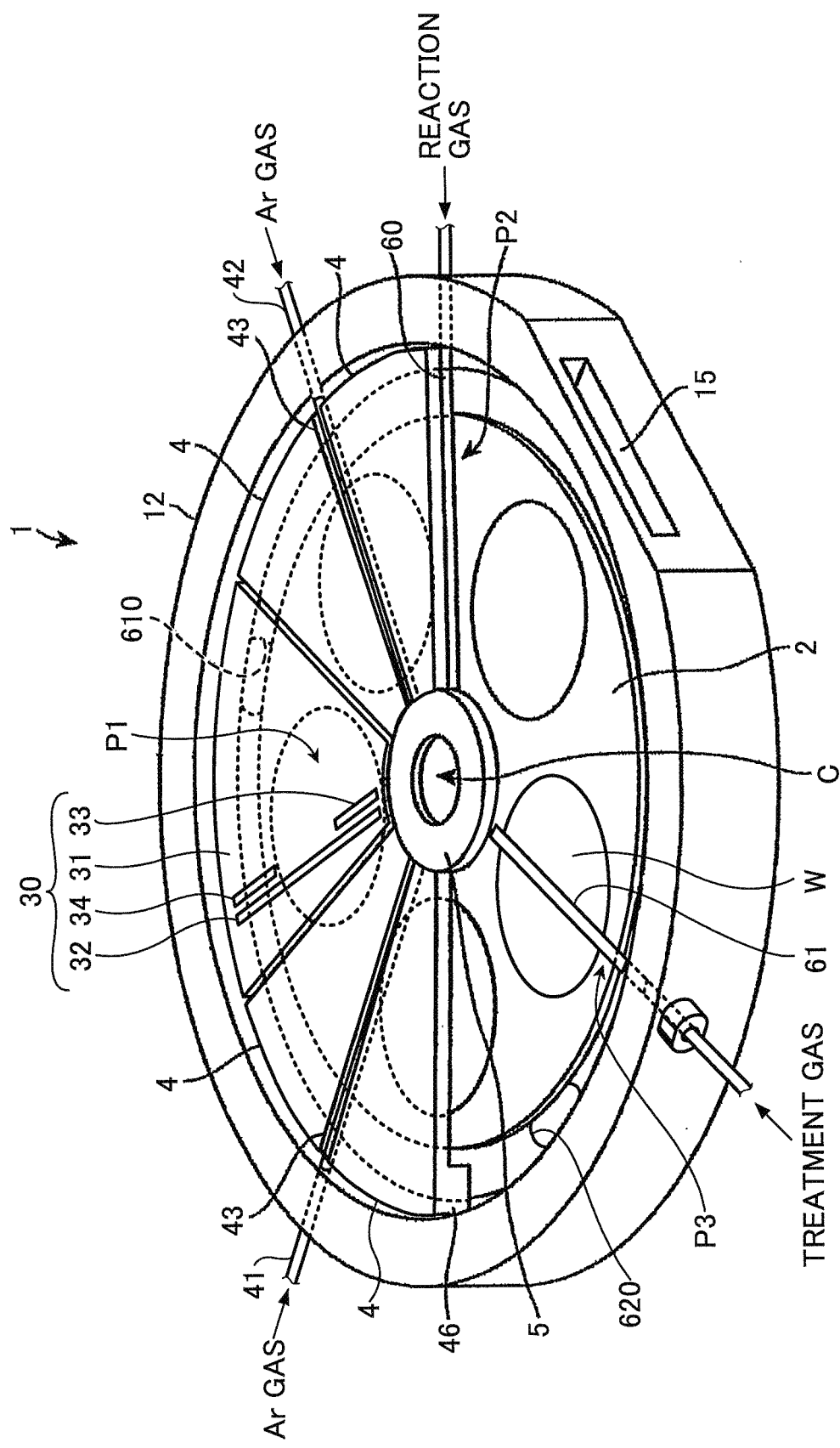
FIG. 2 is a schematic perspective view illustrating an inside structure of a vacuum chamber of the film deposition apparatus according to an embodiment of the present disclosure.
Figure 3:
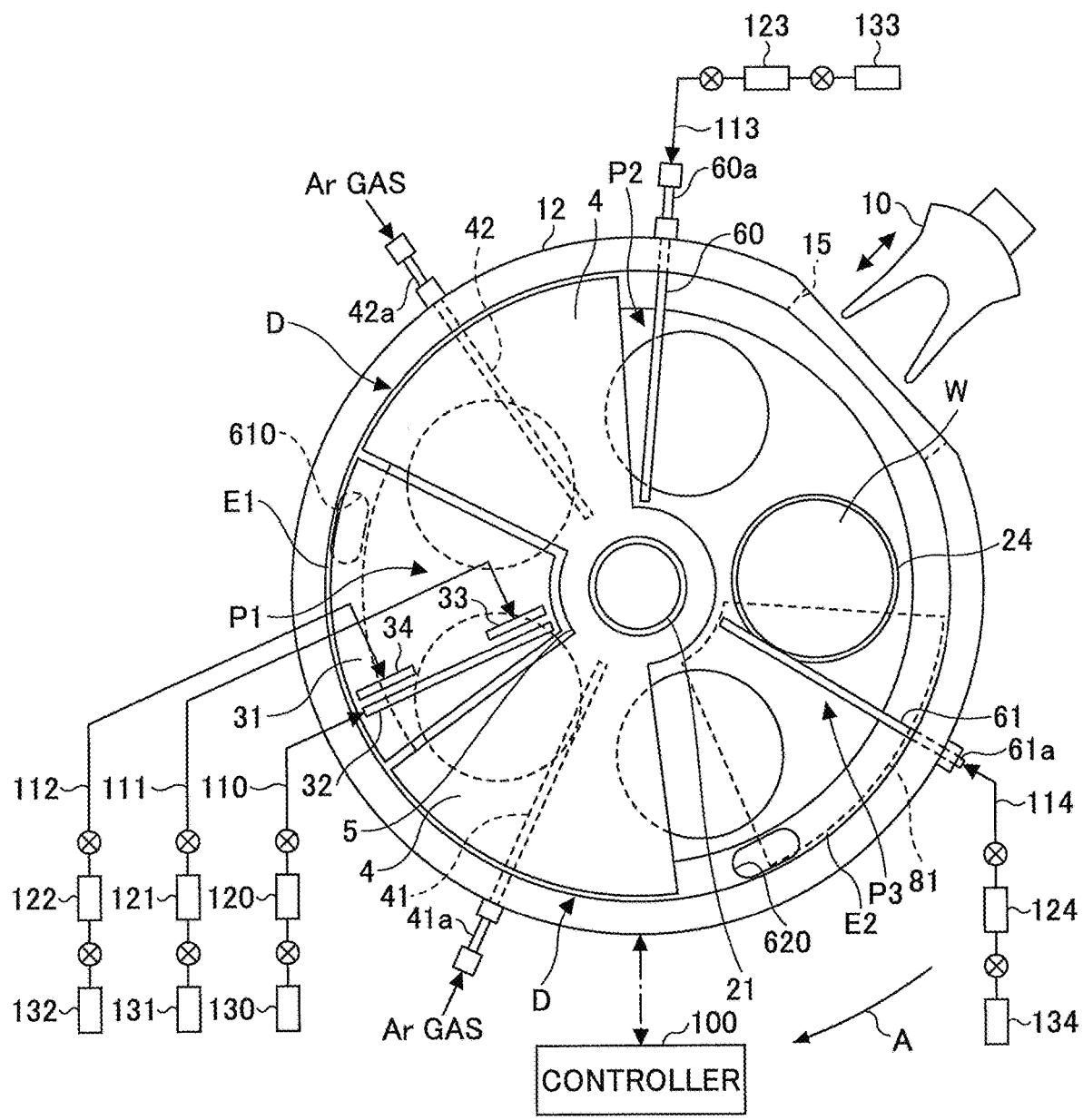
FIG. 3 is a schematic top view illustrating an example of the vacuum chamber of the film deposition apparatus according to an of the present disclosure.

To begin with, a film deposition apparatus according to an embodiment of the present invention is described below. With reference to FIGS. 1 through 3, the film deposition apparatus includes a vacuum chamber 1 having a substantially flat circular shape, and a turntable 2 having a rotational axis coincident with the center of the vacuum chamber 1. The vacuum chamber 1 is a process chamber to contain a wafer therein and to perform a film deposition process on a surface of the wafer. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is provided in the vacuum chamber 1. The turntable 2 is attached to a cylindrical shaped core unit 21 at its center portion. The core unit 21 is fixed to the upper end of a rotary shaft 22 that extends in the vertical direction. The rotary shaft 22 is provided to penetrate the bottom portion 14 of the vacuum chamber 1 and its lower end is attached to a driving unit 23 that rotates the rotary shaft 22 (FIG. 1) about a vertical axis. The rotary shaft 22 and the driving unit 23 are housed in the cylindrical case body 20 whose upper surface is open. The case body 20 is attached to a lower surface of the bottom portion 14 of the vacuum chamber 1 via a flange portion provided at its upper surface in an airtight manner so that inner atmosphere of the case body 20 is isolated from outside atmosphere.

As illustrated in FIGS. 2 and 3, a plurality of (five in the example of the drawing) circular concave portions 24 is provided at a top surface of the turntable 2 along a rotational direction (circumferential direction) to receive the plurality of semiconductor wafers (which will be referred to as "wafers" hereinafter) W, respectively. In FIG. 3, only a single wafer W is illustrated in one of the concave portions 24 for an explanatory purpose. Each of the concave portions 24 is formed to have a slightly larger (for example, 4 mm larger) diameter than that of the wafer W, and a depth substantially equal to the thickness of the wafer W. Thus, when the wafer W is placed in the respective concave portion 24, the surface of the wafer W and the surface of the turntable 2 (where the wafer W is not placed) become almost the same height. Each of the concave portions 24 has three, for example, through holes formed in the bottom, through which lift pins for supporting a back surface of the respective wafer W and lifting the wafer W penetrate (both of which are not illustrated in the drawings).

FIGS. 2 and 3 are diagrams for explaining an inside structure of the vacuum chamber 1. The ceiling plate 11 is not illustrated in FIG. 2 and FIG. 3 for an explanatory purpose. As illustrated in FIGS. 2 and 3, a bottom plate 31 of a showerhead 30 that constitutes a source gas supply region P1, a process gas nozzle 60, a process gas nozzle 61, separation gas nozzles 41 and 42, each of which is made of quartz, for example, are provided above the turntable 2. In the example illustrated in FIG. 3, the process gas nozzle 61, the separation gas nozzle 41, the bottom plate 31, the separation gas nozzle 42, and the process gas nozzle 60 are arranged in this order from a transfer port 15 (which will be explained later) in a clockwise direction (the rotational direction of the turntable 2 as illustrated by an arrow A in FIG. 3) with a space therebetween in a circumferential direction of the vacuum chamber 1. The bottom plate 31 of the showerhead 30 includes a source gas supply part 32, an axial-side supplementary gas supply part 33, and a peripheral-side supplementary gas supply part 34 formed therein. The source gas supply part 32, the axial-side supplementary gas supply part 33, and the peripheral-side supplementary gas supply part 34 are gas supply units to supply a source gas, an axial-side supplementary gas, and a peripheral-side supplementary gas, respectively (hereinafter, the "axial-side supplementary gas" and the "peripheral-side supplementary gas" may be referred to as a "supplementary gas" together). Each bottom surface of the source gas supply part 32, the axial-side supplementary gas supply part 33, and the peripheral-side supplementary gas supply part 34 has a plurality of gas holes (which are not illustrated in the drawings), and supplies the source gas and the supplementary gas along a radial direction of the turntable 2. The source gas supply part 32 extends along the radial direction of the turntable 2 throughout the radius. On the other hand, the axial-side supplementary gas supply part 33 extends only in a predetermined region that has about ⅓ of the source gas supply part 32 on the axial side of the turntable 2. The peripheral-side supplementary gas supply part 34 extends only in a predetermined region that has about ⅓ of the source gas supply part 32 on the peripheral-side of the turntable 2. Any of the gas supply parts 32 through 34 is arranged along the radial direction of the turntable 2. Although detailed later, a gap between the axial-side supplementary gas supply unit 33 and the turntable 2 and a gap between the peripheral-side supplementary gas supply unit 34 and the turntable 2 are formed greater than a gap between the source gas supply unit 32 and the turntable 2. This is because the supplementary gas supply parts 33 and 34 supply supplementary gases for film thickness adjustment to improve uniformity across the surface of the wafer without preventing a flow of the source gas supplied from the source gas supply part 32, but the details are described later.

Gas introduction ports 60a, 61a, 41a, and 42a (FIG. 3) that are base portions of the gas nozzles 60, 61, 41, and 42, respectively, are fixed to an outer peripheral wall of the chamber body 12 so that these nozzles 60, 61, 41, and 42 are introduced into the vacuum chamber 1 from the outer peripheral wall of the vacuum chamber 1 so as to extend in a radial direction and parallel to the surface of the turntable 2.

In contrast, because the source gas supply part 32, the axial-side supplementary gas supply part 33 and the peripheral-side supplementary gas supply part 34 are provided in the bottom plate 31 of the showerhead 30, the source gas and the supplementary gas introduced in the showerhead 30 are introduced into the vacuum chamber 1 through the source gas supply part 32, the axial-side supplementary gas supply part 33 and the peripheral-side supplementary gas supply part 34.

In this embodiment, as illustrated in FIG. 3, the source gas supply part 32 is connected to a supply source 130 (not illustrated in the drawings) of a source gas via a pipe 110, a flow controller 120 and the like (not illustrated in the drawings). The axial-side supplementary gas supply part 33 is connected to a supply source 131 (not illustrated in the drawings) of an axial-side supplementary gas via a pipe 111, a flow controller 121 and the like. Moreover, the peripheral-side supplementary gas supply part 34 is connected to a supply source 132 of a peripheral-side supplementary gas via a pipe 112, a flow controller 122 and the like. Here, the source gas is, for example, a silicon-containing gas such as an organic aminosilane gas, a titanium-containing gas such as TiCl$_4$ and the like. The axial-side supplementary gas and the peripheral-side supplementary gas may be, for example, a noble gas such as Ar or an inert gas such as nitrogen gas, the same gas as the source gas, a mixed gas of these, or another type of gas. A preferable gas to enhance the uniformity across the wafer, for example, a gas intended to adjust a film thickness, is properly selected and used as the supplementary gas depending on the intended use and process.

In FIG. 3, the supply source 130 to 132 are connected to the source gas supply part 32, the axial-side supplementary gas supply part 33 and the peripheral-side supplementary gas supply part 34 on a one-to-one basis, respectively. In the meantime, when supplying a mixed gas, by adding pipes and connecting supply passages with each other, the supply passages may be configured to finally and individually supply mixed gases at an appropriate mix ratio to the source gas supply part 32, the axial-side supplementary gas supply part 33 and the peripheral-side supplementary gas supply part 34. In other words, when mixed gases containing the same gas are supplied to the source gas supply part 32 and the peripheral-side supplementary gas supply part 33, respectively, final mixed gases may be individually supplied to the source gas supply part 32 and the peripheral-side supplementary gas supply part 33 by introducing the same gas from the common gas supply sources 130 to 132. As long as the gases are finally supplied to the source gas supply part 32, the axial-side supplementary gas supply part 33 and the peripheral-side supplementary gas supply part 34 individually, the connecting configuration of the gas supply passages is not limited to a specific configuration.

The process gas nozzle 60 is connected to a supply source 133 of a reaction gas via a pipe 113 and a flow controller 123. The reaction gas is a gas that produces a reaction product by reacting with the source gas. For example, an oxidation gas such as O$_3$ for a silicon-containing gas, and a nitriding gas such as NH$_3$ for a titanium-containing gas are cited as examples.

The process gas nozzle 61 is connected to a supply source 134 of a treatment gas via a pipe 114 and a flow controller 124. The treatment gas is a gas that can generate plasma to improve film quality of the reaction product. In many cases, a gas having the same characteristics as the reaction gas is used. For example, an oxidation gas such as O$_2$ and O$_3$ for a silicon-containing gas, and a nitriding gas such as NH$_3$ and N$_2$ for a titanium-containing gas are cited as examples.

An axial-side nozzle to regionally supply the treatment gas to the axial side of the turntable 2 and a peripheral-side nozzle to regionally supply the treatment gas to the peripheral side of the turntable 2 may be further provided in addition to the process gas nozzle 60 as necessary. FIG. 3 illustrates an example of including only a single process gas nozzle 61 as a nozzle for supplying a plasma gas, but an example of including three nozzles for supplying plasma gases is described later.

The separation gas nozzles 41 and 42 are connected to supply sources (not illustrated in the drawings) of a separation gas via pipes and flow controller valves and the like, respectively. A noble gas such as helium (He) or argon (Ar) or inert gas such as nitrogen (N$_2$) gas can be used as the separation gas. The present embodiment is described by citing an example of using Ar gas as the separation gas.

Each of the process gas nozzles 60 and 61 has a plurality of gas discharge holes 64 (see FIG. 4) that faces downward to the turntable 2 along the longitudinal directions of each of the process gas nozzles 60 and 61 at intervals of 10 mm, for example. A region below the bottom plate 31 of the showerhead 30 is a first process region P1 in which the source gas is adsorbed on the wafers W. A region below the process gas nozzle 60 is a second process region P2 in which a reaction gas that reacts with the source gas adsorbed on the wafer W is supplied, thereby producing a molecular layer of a reaction product. The molecular layer of the reaction product constitutes a film to be deposited. A region below the process gas nozzle 61 is a third process region P3 in which a plasma gas for treatment is supplied to the reaction product (film) produced in the second process region P2, thereby enhancing the film. Here, because the first process region P1 is a region where the source gas is suppled, the first process region P1 may be referred to as a source gas supply region P1. Similarly, because the second process region P2 is a region where the reaction gas reactable with the source gas and capable of producing the reaction product is supplied, the second process region P2 may be referred to as a reaction gas supply region P2. Also, the third process region P3 is a region where the plasma gas for treatment is supplied, the third process region P3 may be referred to as a treatment region P3 or a plasma process region P3.

A plasma generator 81 may be provided above the third process region P3 as necessary. In FIG. 3, the plasma generator 81 is simply illustrated by a dotted line for an explanatory purpose. A detail of the plasma generator 81 is described later.

Referring to FIGS. 2 and 3, the ceiling plate 11 includes two convex portions 4 protruding in the vacuum chamber 1. As will be explained later, the protruding portions are attached to a lower surface of the ceiling plate 11 so as to protrude toward the turntable 2 to form separation regions D with the corresponding separation gas nozzles 41 and 42. Each of the convex portions 4 has substantially a fan-like top view shape where the apex is removed in an arc shape. For each of the convex portions 4, the inner arc shaped portion is connected to a protruding portion 5 (which will be explained later) and the outer arc shaped portion is formed to extend along an inner peripheral surface of the chamber body 12 of the vacuum chamber 1.

Figure 4:
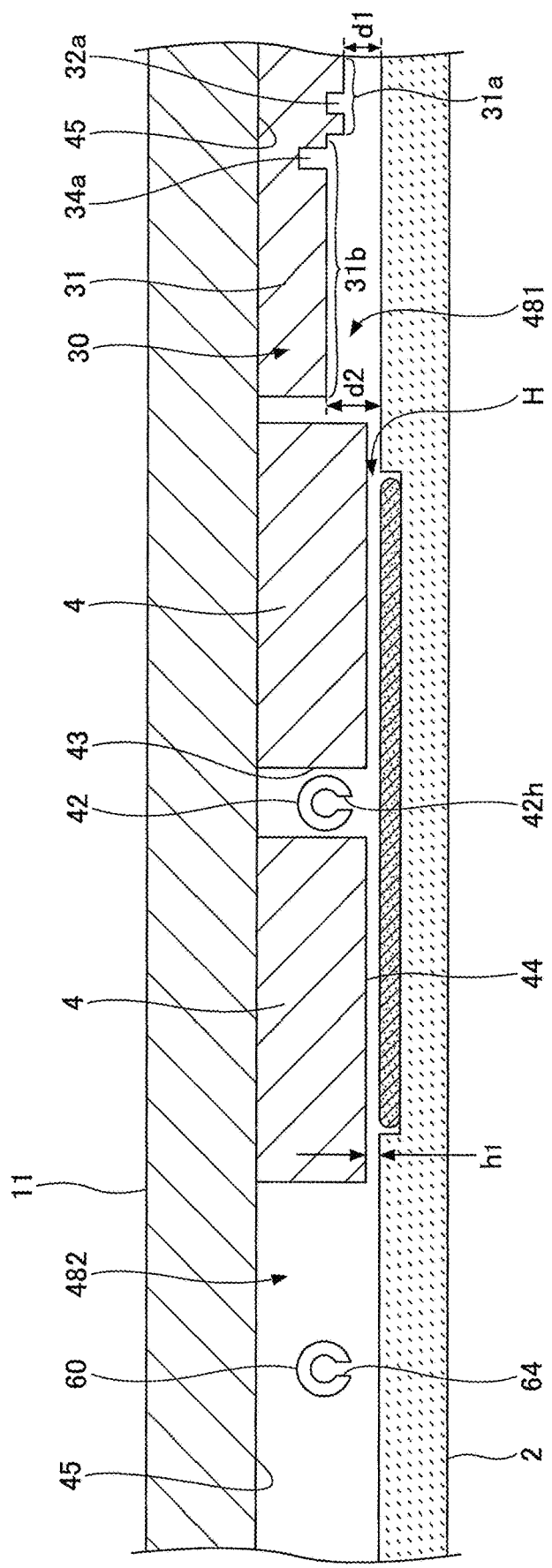
FIG. 4 is a schematic partial cross-sectional view of an example of the film deposition apparatus according to an of the present disclosure.

FIG. 4 illustrates a cross-section of the vacuum chamber 1 along a concentric circle of the turntable 2 from the bottom plate 31 of the showerhead 30 to the process gas nozzle 60. As illustrated in FIG. 4, the convex portion 4 is fixed to the lower surface of the ceiling plate 11. Thus, there are provided a flat low ceiling surface 44 (first ceiling surface) formed as the lower surface of the convex portion 4 and flat higher ceiling surfaces 45 (second ceiling surfaces) which are higher than the low ceiling surface 44 and formed on both sides of the low ceiling surface 44 in the circumferential direction. The low ceiling surface 44 has substantially a fan-like top view shape where the apex is removed in an arc shape. Furthermore, as illustrated in the drawings, the convex portion 4 includes a groove portion 43 at the center in the circumferential direction. The groove portion 43 is formed to extend in the radial direction of the turntable 2. The separation gas nozzle 42 is housed in the groove portion 43. Although not illustrated in FIG. 4, the separation gas nozzle 41 is also housed in a groove portion provided in the other convex portion 4. The bottom plate 31 of the showerhead 30 and the process gas nozzle 60 are provided in spaces below the high ceiling surfaces 45, respectively. The process gas nozzle 60 is provided in the vicinity of the wafers W apart from the high ceiling surfaces 45. Here, as illustrated in FIG. 4, the bottom plate 31 is provided in a space 481 below the high ceiling surface 45 on the right side, and the process gas nozzle 60 is provided in a space 482 below the high ceiling surface 45 on the left side.

Each of the separation gas nozzles 41 and 42 has a plurality of gas discharge holes 42h (see FIG. 4) formed along the longitudinal direction thereof at a predetermined interval (10 mm, for example).

The source gas supply part 32, the axial-side supplementary gas supply part 33 and the peripheral-side supplementary gas supply part 34 provided in the bottom plate 31 of the showerhead 30 have gas discharge holes 32a, 33a and 34a, respectively (not illustrated in FIG. 4). As illustrated in FIG. 4, the gas discharge holes 32a of the source gas supply part 32 are provided almost as high as the gas discharge holes 64 and 42h of the process gas nozzle 60 and the separation gas nozzle 42, while the gas discharge holes 34a of the peripheral-side supplementary gas supply part 34 are provided higher than the gas discharge holes 64 and 42h. In other words, the bottom plate 31 includes a low bottom surface region 31a and a high bottom surface region 31b, and the gas discharge holes 32a are provided in the low bottom surface region 31a while the gas discharge holes 34a are provided in the high bottom surface region 31b. Although not illustrated in FIG. 4, the axial-side supplementary gas supply part 33 is also provided in the high bottom surface region 31b as well as the peripheral-side supplementary gas supply part 34. The technical meaning of the configuration is described later by showing working examples in detail. The axial-side supplementary gas supply part 33 and the peripheral-side supplementary gas supply part 34 are provided for supplement and adjustment. Hence, if the axial-side supplementary gas supply part 33 and the peripheral-side supplementary gas supply part 34 prevent a flow of the source gas supplied from the source gas supply part 32, the axial-side supplementary gas supply part 33 and the peripheral-side supplementary gas supply part 34 cannot achieve the purpose of improving source gas adsorption uniformity across the surface of the wafer. In other words, the axial-side supplementary gas supply part 33 and the peripheral-side supplementary gas supply part 34 need to supply the supplementary gases within a range such that the supplementary gases do not prevent the flow of the source gas, and therefore the distance of the axial-side supplementary gas supply part 33 and the peripheral-side supplementary gas supply part 34 from the surface of the wafer W is preferably longer than the distance between the surface of the wafer W and the source gas supply part 32. Accordingly, a distance d2 between the axial-side and peripheral-side supplementary gas supply parts 33 and 34 and the turntable 2 is set longer than a distance d1 between the source gas supply part 32 and the turntable 2 in the film deposition apparatus of the embodiment. Here, the distance d2 between the axial-side and peripheral-side supplementary gas supply parts 33 and 34 and the turntable 2 can be set to a variety of values as long as the distance d2 is longer than the distance d1 between the source gas supply part 32 and the turntable 2. For example, the distance d2 may be set in 1.1 to 3 times as long as the distance d1, preferably set in 1.5 to 2.5 times as long as the distance d1, and further preferably set in about 2 times as long as the distance d1. Regarding an actual value, for example, when the distance d1 is set at 1.5 mm, the distance d2 may be set at 3 mm that is double of the distance d1.

Moreover, the axial-side supplementary gas supply part 33 and the peripheral-side supplementary gas supply part 34 do not have to be provided at the same height, the axial-side supplementary gas supply part 33 and the peripheral-side supplementary gas supply part 34 may be provided at different heights from each other as long as the axial-side supplementary gas supply part 33 and the peripheral-side supplementary gas supply part 34 are provided higher than the source gas supply part 32.

For example, when the distance between the axial-side supplementary gas supply part 33 and the turntable 2 is set to a distance d3, the distance d2 between the peripheral-side supplementary gas supply part 34 and the turntable 2 may be set longer than the distance d3 between the axial-side supplementary gas supply part 34 and the turntable 2 so that the relationship "d1<d3<d2" is satisfied.

The low ceiling surface 44 provides a separation space H, which is a narrow space, with respect to the turntable 2. When $N_2$ gas is supplied from the separation gas nozzle 42 to the separation space H, this $N_2$ gas flows toward the space 481 and the space 482 through the separation space H. On this occasion, because the volume of the separation space H is smaller than those of the spaces 481 and 482, the pressure in the separation space H can be made higher than those in the spaces 481 and 482 by $N_2$ gas. It means that the separation space H having the higher pressure is formed between the spaces 481 and 482. Moreover, $N_2$ gas flowing from the separation space H toward the spaces 481 and 482 functions as a counter flow against the first reaction gas from the gas first process area P1 and the second reaction gas from the second process area P2. Thus, the first reaction gas from the first process area P1 is separated from the second reaction gas from the second process area P2 by the separation space H. Therefore, mixing and reacting of the first reaction gas with the second reaction gas are prevented in the vacuum chamber 1.

The height h1 of the low ceiling surface 44 above an upper surface of the turntable 2 is preferred to be appropriately determined based on the pressure of the vacuum chamber 1 during the film deposition, the rotational speed of the turntable 2, and a supplying amount of the separation gas (Ar gas) in order to maintain the pressure in the separation space H higher than those in the spaces 481 and 482.

Referring to FIGS. 1 through 3, the ceiling plate 11 further includes the protruding portion 5 at its lower surface to surround the outer periphery of the core unit 21 which fixes the turntable 2. The protruding portion 5 is continuously formed with the inner portions of the convex portions 4 and has a lower surface which is formed at the same height as those of the low ceiling surfaces 44, in this embodiment.

Figure 5:
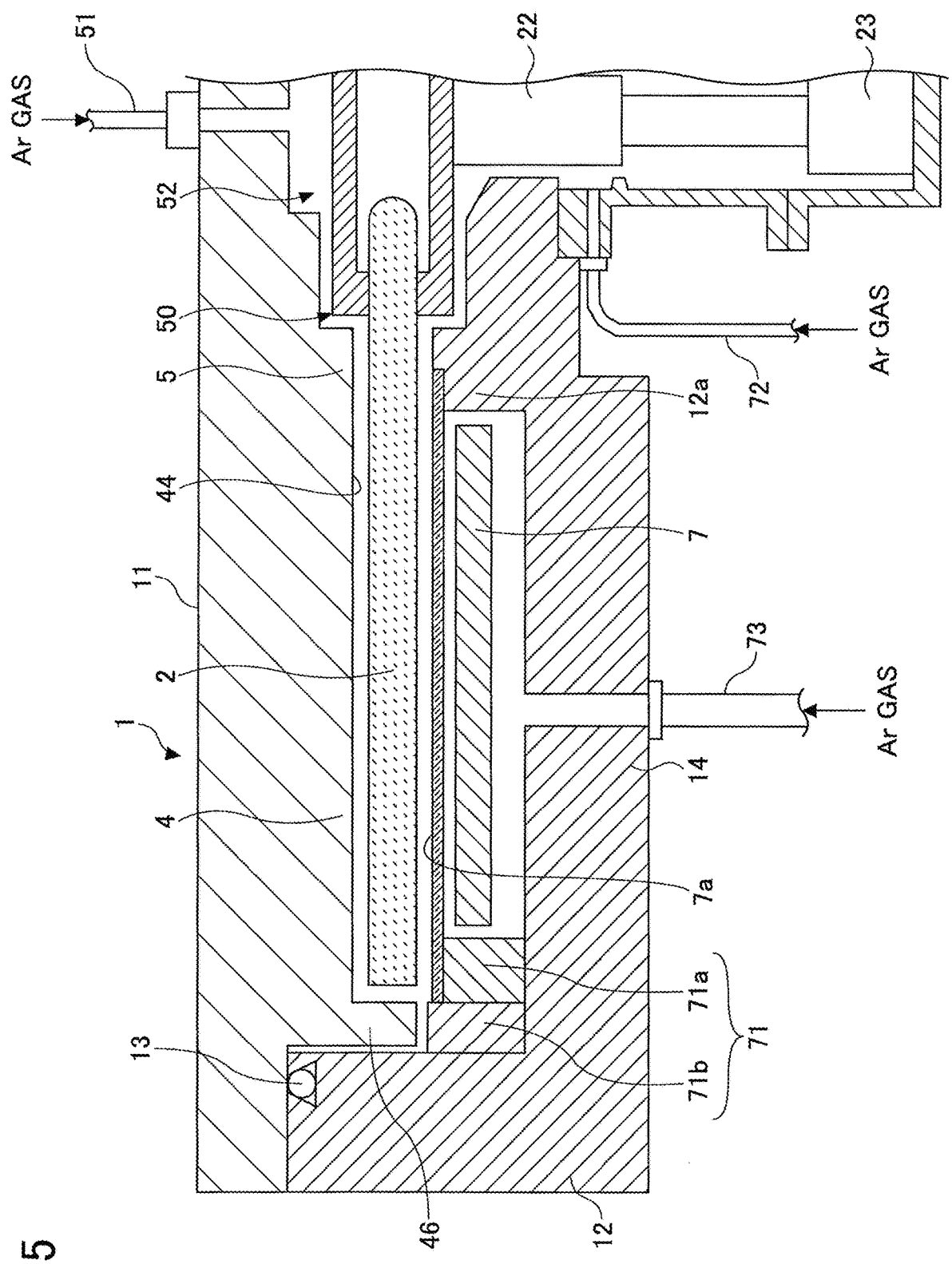
FIG. 5 is another schematic cross-sectional view of the film deposition apparatus of the present disclosure.

FIG. 5 is a partial cross-sectional view illustrating an area where the ceiling surface 44 is provided. As illustrated in FIG. 5, the convex portion 4 having a substantially fan-like top view shape includes an outer bending portion 46 at its outer peripheral end portion (at an outer peripheral end portion side of the vacuum chamber 1) which is bent to have an L-shape to face an outer end surface of the turntable 2. The outer bending portion 46 inhibits a flow of gas between the space 481 and the space 482 through the space between the turntable 2 and the inner peripheral surface of the chamber body 12. As described above, the convex portions 4 are provided on the ceiling plate 11 which is detachably attached to the chamber body 12. Thus, there is a slight space between the outer periphery surface of the outer bending portion 46 and the chamber body 12. The spaces between the inner periphery surface of the outer bending portion 46 and an outer surface of the turntable 2, and the space between the outer periphery surface of the outer bending portion 46 and the chamber body 12 are set at the same size as the height h1 (see FIG. 4) of the low ceiling surface 44 with respect to the upper surface of the turntable 2, for example.

As illustrated in FIG. 5, the inner peripheral wall of the chamber body 12 is provided to extend in a vertical direction to be closer to the outer peripheral surface of the outer bending portion 46 at the separation area H. However, other than the separation area H, as illustrated in FIG. 1, for example, the inner peripheral wall of the chamber body 12 is formed to have a concave portion recessed outward from a location facing the outer end surface of the turntable 2 to the upper end of the bottom portion 14. Hereinafter, for an explanatory purpose, the concave portion, having a substantially rectangular cross-sectional view, is referred to as an "evacuation region". Specifically, a part of the evacuation region which is in communication with the first process area P1 is referred to as a first evacuation region E1, and a part of the evacuation region which is in communication with the second and third process areas P2 and P3 is referred to as a second evacuation region E2. As illustrated in FIGS. 1 through 3, a first evacuation port 610 and a second evacuation port 620 are respectively provided at the bottom portions of the first evacuation region E1 and the second evacuation region E2. The first evacuation port 610 and the second evacuation port 620 are connected to vacuum pumps 640, which are vacuum evacuation units, via evacuation pipes 630, respectively, as illustrated in FIG. 1. Moreover, automatic pressure controllers (APC) 650 that are pressure adjustment units are provided in the evacuation pipes 630 between the vacuum pump 640 and the first exhaust opening 610 and between the vacuum pump 640 and the second exhaust opening 620, respectively. Thus, the exhaust pressures of the first exhaust opening 610 and the second exhaust opening 620 are configured to be controllable independently of each other.

The heater unit 7 is provided at a space between the turntable 2 and the bottom portion 14 of the vacuum chamber 1 as illustrated in FIG. 1 and FIG. 5. The wafers W mounted on the turntable 2 are heated by the heater unit 7 via the turntable 2 to a temperature (450° C., for example) determined by a process recipe. A ring cover member 71 is provided at a lower portion side of the outer periphery of the turntable 2 in order to prevent gasses from being introduced into the space below the turntable 2. The cover member 71 includes an inner member 71a provided under the periphery and outside of the turntable 2 and an outer member 71b provided between the inner member 71a and the inner side wall of the vacuum chamber 1. The outer member 71b is provided to face the outer bending portion 46, which is formed at an outer edge portion at lower side of each of the convex portions 4. The inner member 71a is provided to surround the entirety of the heater unit 7 below the outer end portion (and at a slightly outer side of the outer edge portion) of the turntable 2.

The bottom portion 14 of the vacuum chamber 1 closer to the rotation center than the space where the heater unit 7 is provided protrudes upward to be close to the core unit 21 to form a projecting portion 12a. There is provided a narrow space between the projecting portion 12a and the core unit 21. Furthermore, there is provided a narrow space between an inner peripheral surface of the bottom portion 14 and the rotary shaft 22 to be in communication with the case body 20. A purge gas supplying pipe 72 which supplies $N_2$ gas as the purge gas to the narrow space for purging is provided in the case body 20. The bottom portion 14 of the vacuum chamber 1 includes a plurality of purge gas supplying pipes 73 (only one of the purge gas supplying pipes 73 is illustrated in FIG. 5) which are provided at a predetermined angle interval in the circumferential direction below the heater unit 7 for purging the space where the heater unit 7 is provided. Moreover, a cover member 7a is provided between the heater unit 7 and the turntable 2 to prevent the gas from going into the space where the heater unit 7 is provided. The cover member 7a is provided to extend from an inner peripheral wall (upper surface of the inner member 71a) of the outer member 71b to an upper end portion of the projecting portion 12a in the circumferential direction. The cover member 7a may be made of quartz, for example.

The film deposition apparatus 1 further includes a separation gas supplying pipe 51 that is connected to a center portion of the ceiling plate 11 of the vacuum chamber 1 and provided to supply Ar gas as the separation gas to a space 52 between the ceiling plate 11 and the core unit 21. The separation gas supplied to the space 52 flows through a narrow space between the protruding portion 5 and the turntable 2 so as to flow along the top surface of the turntable 2 where the wafers W are to be placed and is discharged toward the outer periphery. The space 50 is kept at a pressure higher than those of the space 481 and the space 482 by the separation gas. Thus, the mixing of a Si-containing gas supplied to the first process region P1 and an oxidation gas supplied to the second process region P2 by flowing through the center area C can be prevented by the space 50. It means that the space 50 (or the center region C) can function similarly to the separation space H (or the separation region D).

Thus, the noble gas such as Ar or the inert gas such as $N_2$ (both of which may be referred to as a "purge gas" hereinafter) is supplied to the axial side of the turntable 2 from above and below by the separation gas supply pipe 51 and the purge gas supply pipe 72. When the flow rate of the source gas is set at a small flow rate, for example, 30 sccm or lower, the concentration of the source gas may become low on the axial side of the turntable 2 because of Ar gas supplied to the axial side of the turntable 2, which may degrade the uniformity of film thickness across the surface of the wafer W. The film deposition apparatus according to the present embodiment can decrease the negative impact by the purge gas flowing out of the axial side of the turntable 2 without being controlled and can appropriately control the concentration of the source gas by providing the axial-side supplementary gas supply part 32 on the axial side and supplying the supplementary gas therefrom. In view of this, because the axial-side supplementary gas supply part 33 plays a more important role than that of the peripheral-side supplementary gas supply part 34, the bottom plate 31 of the gas showerhead 30 may be configured to include only the source gas supply part 32 and the axial-side supplementary gas supply part 33. Even the film deposition apparatus having such a configuration can prevent the film thickness from decreasing on the axial side and get a sufficient effect. However, in order to respond to a variety of processes and to accurately adjust the film thickness, the film deposition apparatus preferably includes not only the axial-side supplementary gas supply part 33 but also the peripheral-side supplementary gas supply part 34.

As illustrated in FIGS. 2 and 3, a transfer port 15 is formed in a side wall of the vacuum chamber 1 for allowing the wafers W, which are substrates, to pass between an external transfer arm 10 and the turntable 2. The transfer port 15 is opened and closed by a gate valve (not illustrated in the drawings). Furthermore, lift pins, which penetrate through the concave portion 24 to lift up the wafer W from a backside surface, and a lifting mechanism for the lift pins (both are not illustrated in the drawings) are provided at a location where the wafer W is transferred and below the turntable 2 because the wafer W is transferred between the external transfer arm 10 and the concave portion 24 of the turntable 2, which is a substrate receiving area, at a location facing the transfer port 15.

As illustrated in FIG. 1, the film deposition apparatus according to the present embodiment further includes a controller 100 that controls the entirety of the film deposition apparatus. The controller 100 may be a computer. A memory inside the controller 100 stores a program by which the film deposition apparatus executes the film deposition method (as will be explained later) under a control of the controller 100. The program is formed to include steps capable of executing the film deposition method. The program is stored in a recording medium 102 such as a hard disk, a compact disk (CD), a magneto-optic disk, a memory card, a flexible disk, or the like. The program is read into a memory unit 101 using a predetermined reading device and installed in the memory inside the controller 100.

Next, the configuration of the showerhead 30 including the bottom plate 31 in the film deposition apparatus according to an embodiment of the present disclosure is described below.

Figure 6:
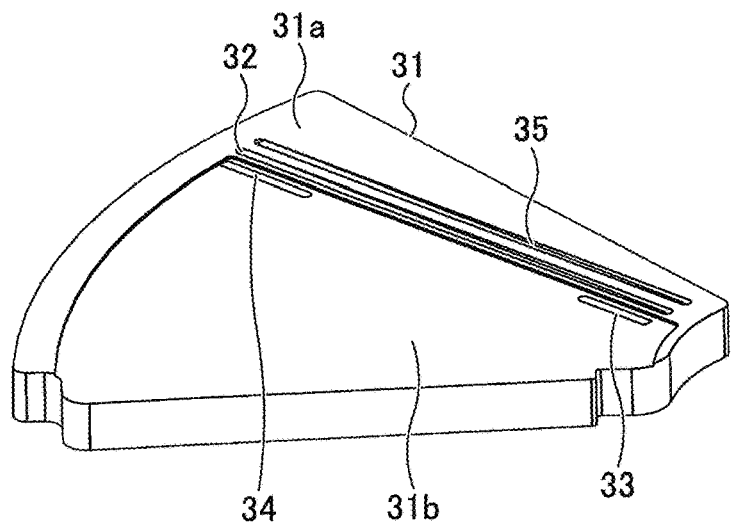
FIG. 6 is a diagram illustrating an example of a configuration of a lower surface of a bottom plate of a showerhead in the film deposition apparatus according to an of the present disclosure.

FIG. 6 is a diagram illustrating an example of the configuration of a bottom surface (lower surface) of the bottom plate 31 of the showerhead 30. As illustrated in FIG. 6, the low bottom surface region 31a and the high bottom surface region 31b are formed in the lower surface of the bottom plate 31. The source gas supply part 32 is formed in the low bottom surface region 31a, and the axial-side supplementary gas supply part 33 and the peripheral-side supplementary gas supply part 34 are formed in the high bottom surface region 31b. The bottom plate 31 has an approximately fan-like shape in planner view as a whole, spreading from the axial side, which corresponds to the center of the fan-like shape. The low bottom surface region 31a has a narrow area that is about ⅕ to about ¼ of the high bottom surface region 31b. The low bottom surface region 31a is provided upstream of the high bottom surface region 31b in the rotational direction of the turntable 2, and all of the source gas supply part 32, the axial-side supplementary gas supply part 33 and the peripheral-side gas supply part 34 are provided upstream of the bilaterally symmetric center line that extends along the radius of the turntable and equally divides the outer arc and inner arc into two. The axial-side supplementary gas supply part 33 and the peripheral-side supplementary gas supply part 34 are provided in the vicinity of the source gas supply part 32, and are provided at positions where the axial-side supplementary gas supply part 33 and the peripheral-side supplementary gas supply part 34 can adjust the concentration of the source gas supplied from the source gas supply part 32.

A cleaning gas supply part 35 is provided upstream of the source gas supply part 32 in the low bottom surface region 31a. The cleaning gas supply part 35 is a gas supply unit to supply a cleaning gas used in cleaning the vacuum chamber 1, and is used in performing maintenance as necessary. The cleaning gas supply part 35 is not an essential element, but may be provided as necessary.

Figure 7:
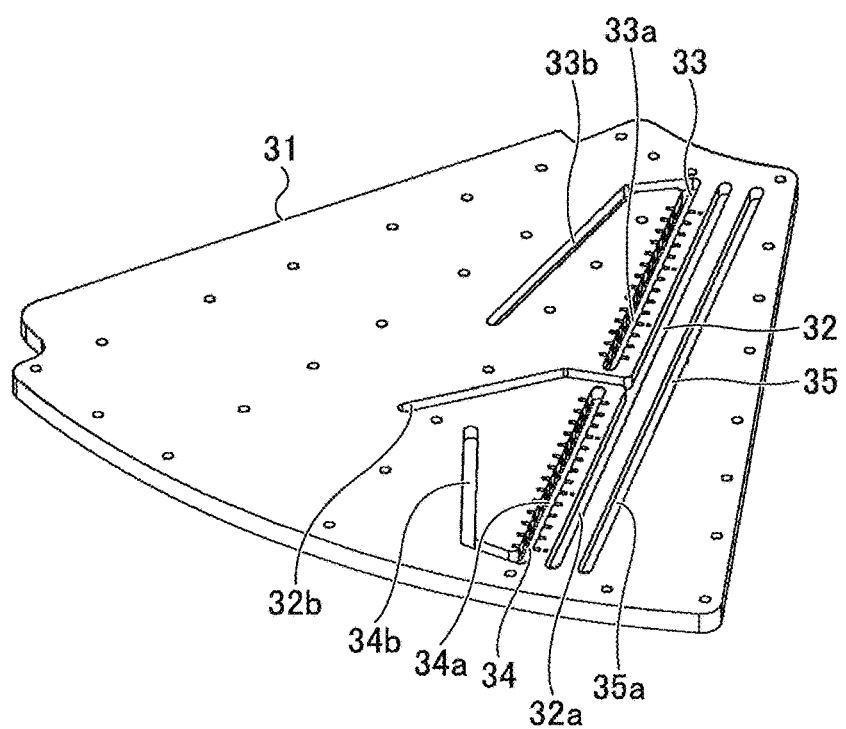
FIG. 7 is a diagram illustrating an example of a configuration of an upper surface of a bottom plate of a showerhead in the film deposition apparatus according to an of the present disclosure.

FIG. 7 is a diagram illustrating an example of a configuration of an upper surface of the bottom plate 31 of the showerhead 30. As illustrated in FIG. 7, the source gas supply part 32, the axial-side supplementary gas supply part 33, the peripheral-side supplementary gas supply part 34 and the cleaning gas supply part 35 are provided at locations corresponding to the locations illustrated in FIG. 6, respectively. Also, FIG. 7 illustrates gas discharge holes 32a provided in the bottom surface of the source gas supply part 32 and a source gas supply passage 32b connected to the source gas supply part 32. Similarly, the axial-side supplementary gas supply part 33 has axial-side supplementary gas discharge holes 33a in its bottom surface, and an axial-side supplementary gas supply passage 33b connected to the axial-side supplementary gas supply part 33 is provided. Moreover, the peripheral-side supplementary gas supply part 34 has peripheral-side supplementary gas discharge holes 34a in its bottom surface, and a peripheral-side supplementary gas supply passage 34b connected to the peripheral-side supplementary gas supply part 34 is provided. Furthermore, the cleaning gas supply part 35 has cleaning gas discharge holes 35a in its bottom surface. Here, any gas supply passage is not connected to the cleaning gas supply part 35 because a supply passage of the cleaning gas is provided at a different height from the bottom plate 31, and is not provided in the bottom plate 31.

The gas discharge holes 32a, 33a, 34a and 35a are linearly arranged in the bottom surfaces of the linearly formed gas supply parts 32, 33, 33, 34 and 35, respectively. In addition, the axial-side supplementary gas supply part 33 and the peripheral-side supplementary gas supply part 34 have longer shapes than the shapes illustrated in FIGS. 2, 3 and 6, but the axial-side supplementary gas supply part 33 and the peripheral-side supplementary gas supply part 34 in FIG. 7 can be formed into the same shape as those in FIGS. 2, 4 and 6 by plugging unnecessary grooves in the central portion. Thus, the lengths of the axial-side supplementary gas supply part 33 and the peripheral-side supplementary gas supply part 34 can be adjusted depending on the intended use.

Figure 8:
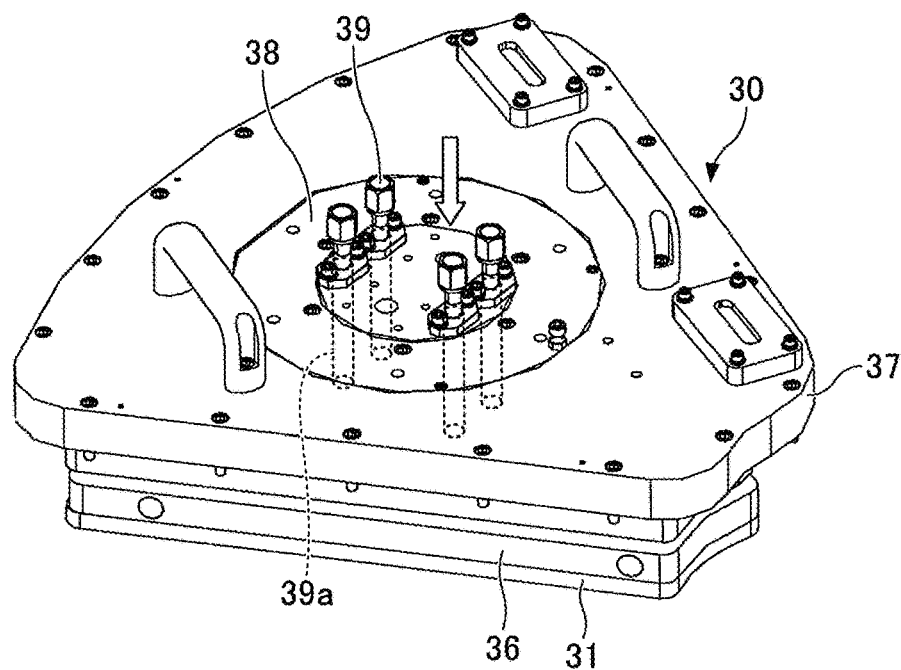
FIG. 8 is a diagram illustrating an example of an overall configuration of a showerhead in the film deposition apparatus according to an of the present disclosure.

FIG. 8 is a perspective view illustrating an example of an overall configuration of the showerhead 30. As illustrated in FIG. 8, the showerhead 30 includes the bottom plate 31, a middle stage part 36, an upper stage part 37, a central part 38 and gas introduction parts 39. The showerhead 30 including the bottom plate 31 may be made of a metal material such as aluminum.

The gas introduction parts 39 are inlets to introduce a source gas and a supplementary gas, further a cleaning gas as necessary from the outside, and are configured as joints, for example. Four gas introduction parts 39 are provided corresponding to four gas supply passages 32 through 35, and are configured to be able to supply gases independently. Gas introduction passages 39a are formed under the gas introduction parts 39, and are configured to be directly connectable with the gas supply passages 32a, 33a and 34a described in FIG. 7.

The central part 38 includes the gas introduction parts 39 and the gas introduction passages 39a, and is configured to be rotatable. Thus, an angle of the showerhead 30 can be adjusted, and the positions of the source gas supply part 32, the axial-side supplementary gas supply part 33 and the peripheral-side supplementary gas supply part 34 can be finely adjusted.

The upper stage part 37 serves as an upper frame, and is structured to be installable in the ceiling plate 11. The middle stage part 36 plays a role of connecting the upper stage part 37 with the bottom plate 31, and also serves as a supply passage of the cleaning gas because a cleaning gas supply passage of the cleaning gas supply part 35 is formed therein.

Figure 9:
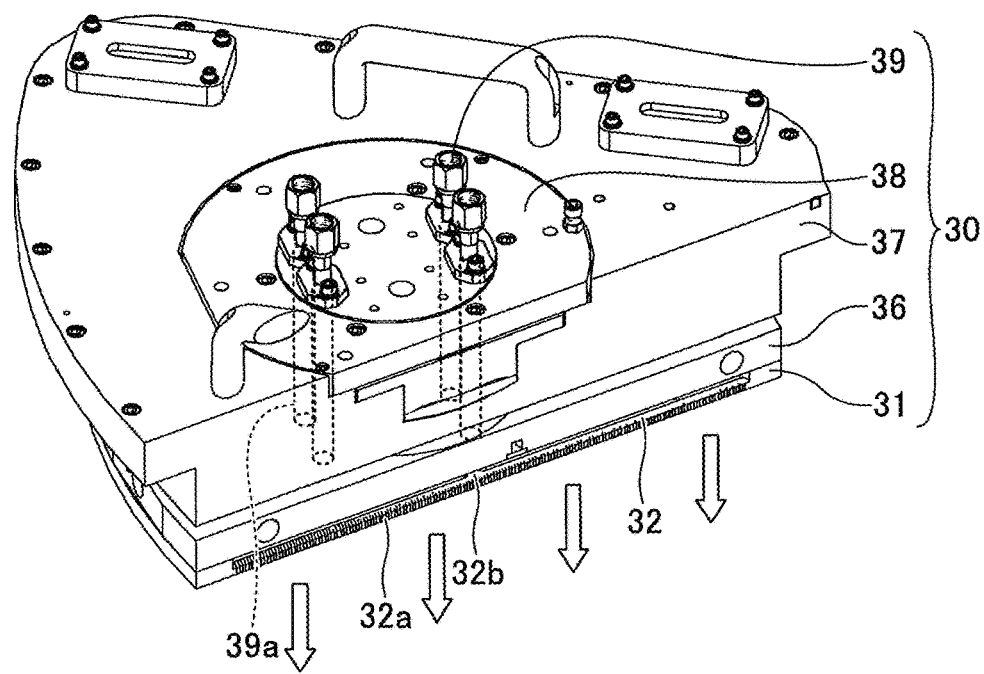
FIG. 9 is a perspective cross-sectional view taken along a source gas supply part of a showerhead in a film deposition apparatus according to an embodiment of the present disclosure.

FIG. 9 is a perspective cross-sectional view taken along the source gas supply part 32. As illustrated in FIG. 9, the showerhead 30 is configured so that a source gas supplied from one of the gas introduction parts 39 is supplied to the gas supply part 32 via a source gas supply passage 32b, and that the source gas is supplied from the source gas discharge holes 32a to the turntable 2 in a shower form.

Figure 10:
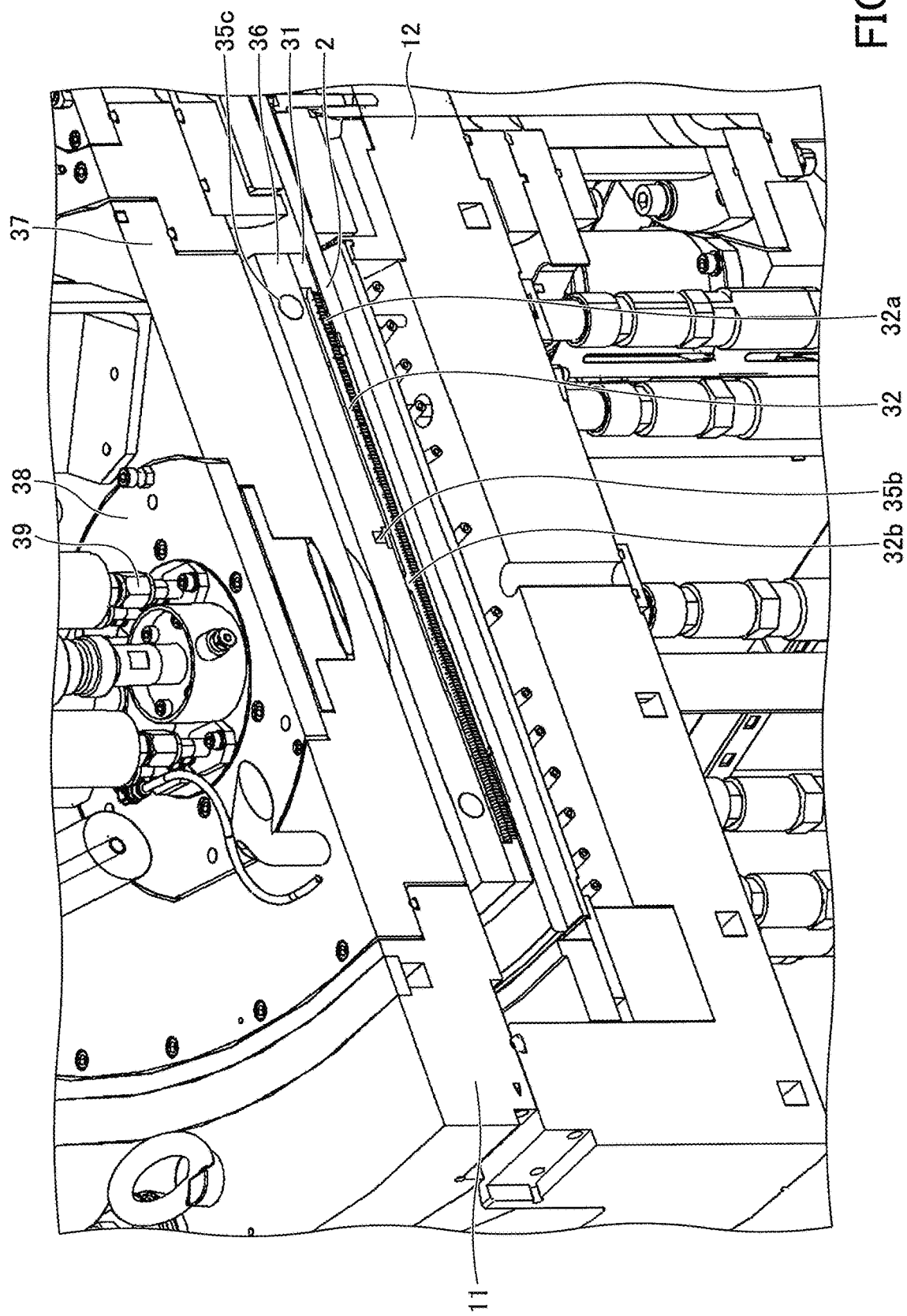
FIG. 10 is a perspective cross-sectional view of a showerhead installed in a film deposition apparatus, taken along a line passing through a source gas supply part of a showerhead.

FIG. 10 is a perspective cross-sectional view of the showerhead 30 installed in the film deposition apparatus taken along a line passing through the source gas supply part 32. As illustrated in FIG. 10, the source gas supply part 32 and the gas discharge holes 32a are linearly arranged along the radial direction of the turntable 2 with a length capable of covering at least the diameter of the wafer W. Here, cleaning gas supply passages 35b and 35c connected to the cleaning gas supply part 35 are formed in the middle stage part 36.

Figure 11:
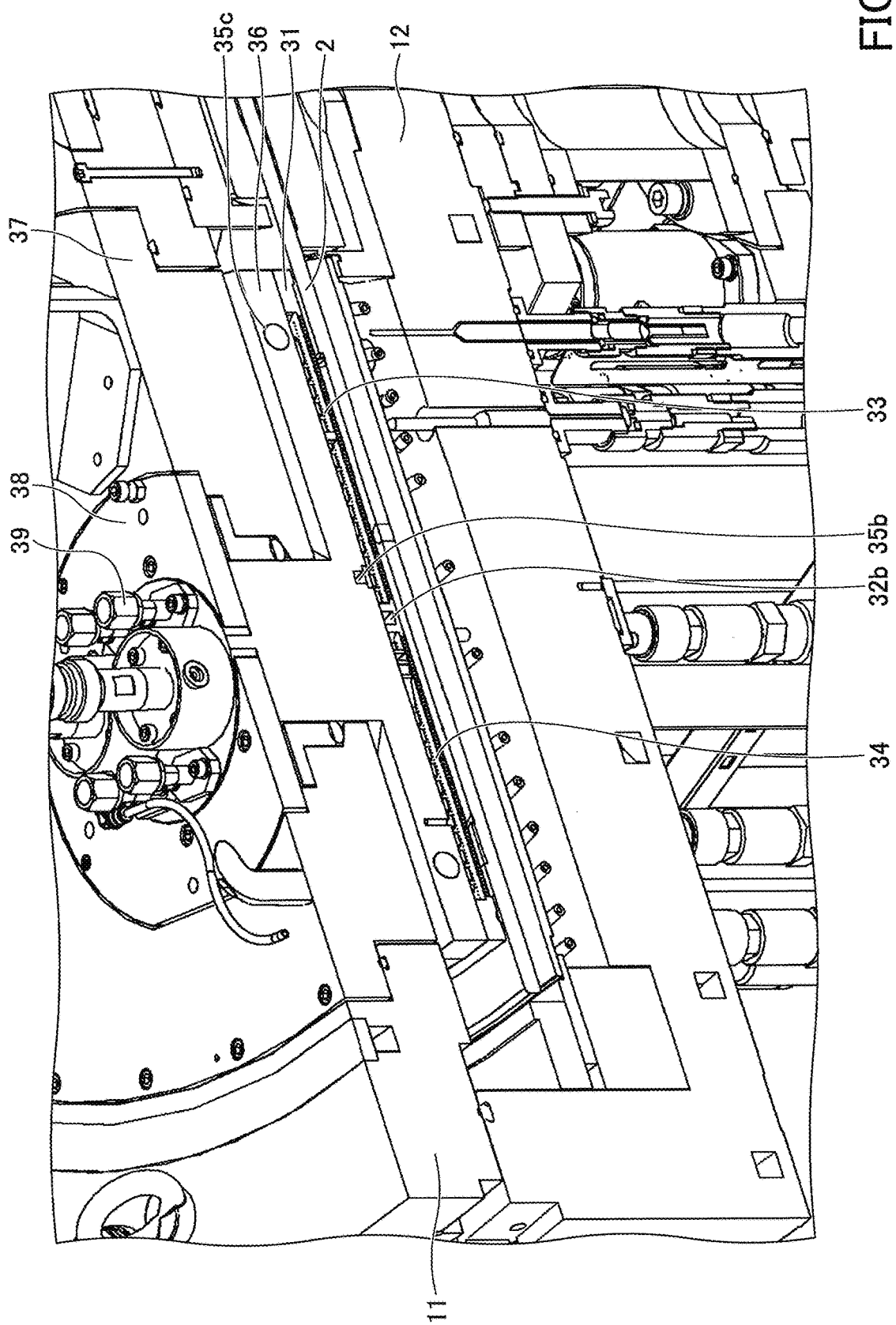
FIG. 11 is a perspective cross-sectional view of a showerhead installed in a film deposition apparatus, taken along a line passing through an axial-side supplementary gas supply part and a peripheral-side supplementary gas supply part.

FIG. 11 is a perspective cross-sectional view of the showerhead 30 installed in the film deposition apparatus taken along a line passing through the axial-side supplementary gas supply part 33 and the peripheral-side supplementary gas supply part 34. As illustrated in FIG. 11, the axial-side supplementary gas supply part 33 and the peripheral-side supplementary gas supply part 34 are linearly arranged along the radial direction of the turntable 2 with lengths capable of covering predetermined ranges on the axial side and the peripheral side of the wafer W. Here, the lengths of the axial-side supplementary gas supply part 33 and the peripheral-side supplementary gas supply part 34 are adjustable by plugging the grooves of the axial-side supplementary gas supply part 33 and the peripheral-side supplementary gas supply part 34, as described in FIG. 7. Also, the supplementary gas discharge holes 33a and 34a are linearly arranged in the bottom surfaces of the axial-side supplementary gas supply part 33 and the peripheral-side supplementary gas supply part 34, as described in FIG. 7. Also, similarly to FIG. 10, the cleaning gas supply passages 35b and 36c connected to the cleaning gas supply part 35 are provided in the middle stage part 36.

Thus, the film deposition apparatus according to the present embodiment can deposit a film at a small flow rate of the source gas while enhancing the film thickness uniformity across the wafer W by including, in addition to the source gas supply part 32, the axial-side supplementary gas supply part 33 at the distance d3 from the turntable 2 that is longer than the distance d1 between the source gas supply part 32 and the turntable 2. Furthermore, the film deposition apparatus of the present embodiment can deposit a film while further enhancing the film thickness uniformity across the wafer W by further including the peripheral-side supplementary gas supply part 34 at the distance d2 from the turntable 2 that is longer than or equal to the distance d3 between the axial-side supplementary gas supply part 33 and the turntable 2, as necessary.

FIGS. 6 through 11 illustrate an example of introducing the source gas and the supplementary gas from the gas introduction part 39 by way of the gas introduction passage 39a, the source gas supply passage 32b, and the supplementary gas supply passages 33b and 34b. However, the source gas and the supplementary gas can be supplied to the source gas supply part 32, the axial-side supplementary gas supply part 33 and the peripheral-side gas supply passage 34 only via the gas introduction part 39 and the gas introduction passage 39a, without flowing through the source gas supply passage 32b and the supplementary gas supply passages 33b and 34b, depending on the arrangement of the gas introduction part 39. In this case, the bottom plate 31 is configured as illustrated in FIGS. 2 and 3.

In addition, the present embodiment illustrates an example of forming the source gas supply part 32 and the supplementary gas supply parts 33 and 34 together into the showerhead 30, but as long as the relationship of distances d1, d2 and D3 from the turntable 2 are satisfied, each of the source gas supply part 32 and the supplementary gas supply parts 33 and 34 can be formed into a gas nozzle, similarly to the process gas nozzles 60 and 61. Forming the source gas supply part 32, the axial-side supplementary gas nozzle 33 and the peripheral-side gas nozzle 34 into independent gas nozzles do not cause any problem because the nozzles do not substantially differ from the showerhead 30 other than a difference of a way of supplying the gas.

Next, a plasma generator 81 mounted on the film deposition apparatus according to the present embodiment as necessary, is described below.

Figure 12:
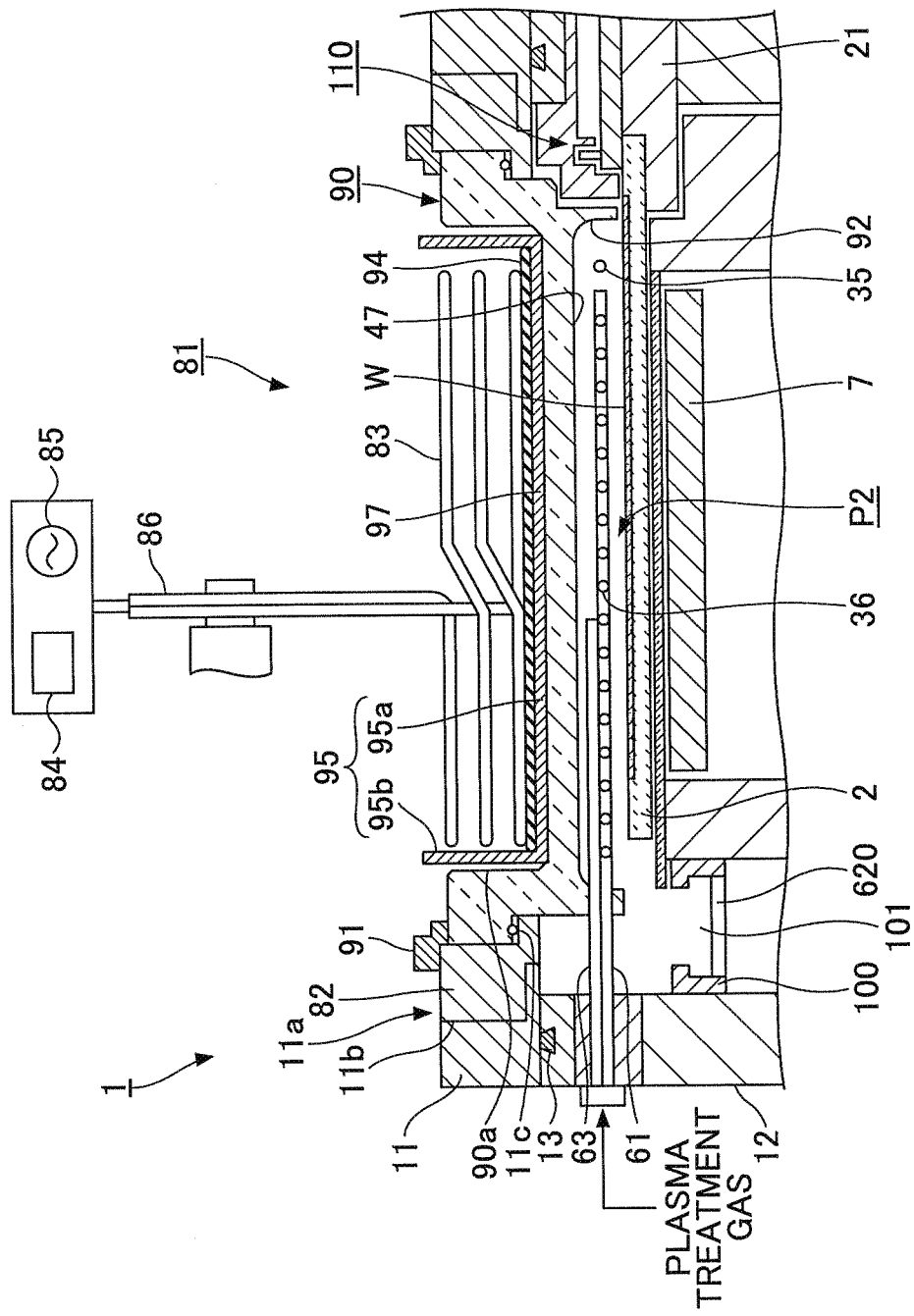
FIG. 12 is a vertical cross-sectional view of an example of a plasma generator according to an embodiment of the present disclosure.
Figure 13:
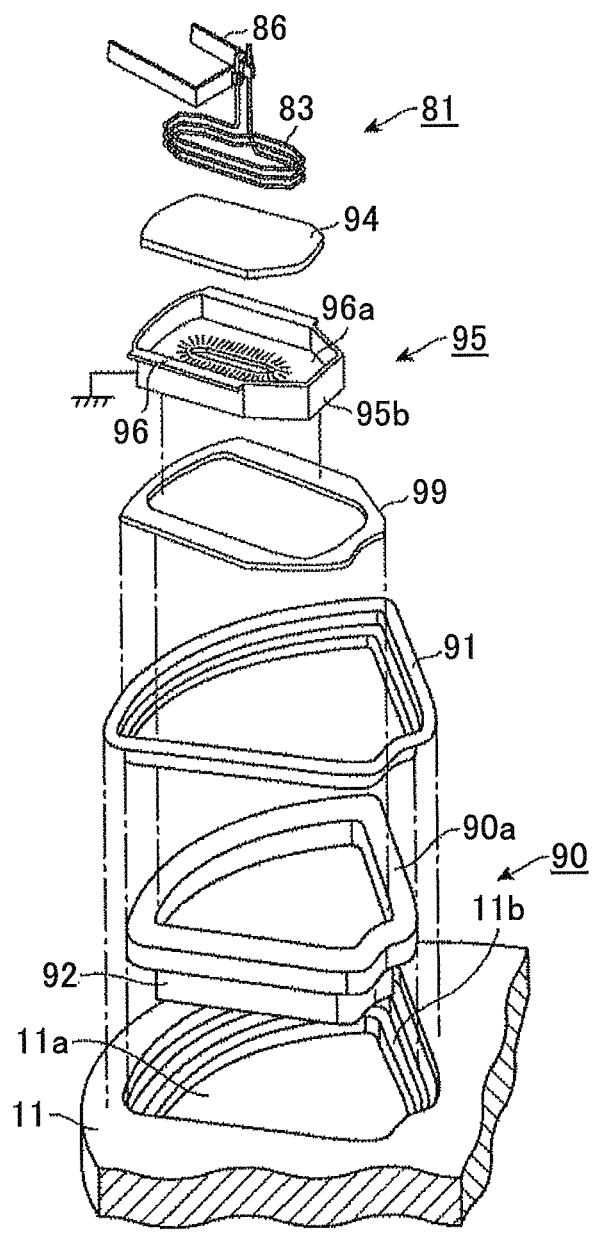
FIG. 13 is an exploded perspective view of a plasma generator according to an embodiment of the present disclosure.

FIG. 12 illustrates a vertical cross-sectional view of an example of the plasma generator according to the present embodiment. FIG. 13 illustrates an exploded perspective view of the plasma generator according to the present embodiment.

The plasma generator 81 is configured to

The plasma generator 81 is configured by winding an antenna 83 made of a metal wire or the like, for example, three times around a vertical axis in a coil form. In a plan view, the plasma generator 81 is disposed to surround a strip-shaped area extending in the radial direction of the turntable 2 and to extend across the diameter of the wafer W on the turntable 2.

The antenna 83 is connected through a matching box 84 to a radio frequency power source 85 that has, for example, a frequency of 13.56 MHz and output power of 5000 W. The antenna 83 is hermetically separated from the inner area of the vacuum chamber 1. As illustrated in FIGS. 1, 2, and 4, a connection electrode 86 electrically connects the antenna 83, the matching box 84, and the radio frequency power source 85.

As illustrated in FIGS. 12 and 13, an opening 11a having an approximately sectorial shape in a plan view is formed in the top plate 11 above the process gas nozzles 33 through 35.

As illustrated in FIG. 12, a ring-shaped member 82 is hermetically attached to the periphery of the opening 11a. The ring-shaped member 82 extends along the periphery of the opening 11a. The housing 90 is hermetically attached to the inner circumferential surface of the ring-shaped member 82. That is, the outer circumferential surface of the ring-shaped member 82 faces an inner surface 11b of the opening 11a of the top plate 11, and the inner circumferential surface of the ring-shaped member 82 faces a flange part 90a of the housing 90. The housing 90 is placed via the ring-shaped member 82 in the opening 11a to enable the antenna 83 to be placed at a position lower than the top plate 11. The housing 90 may be made of a dielectric material such as quartz. The bottom surface of the housing 90 forms a ceiling surface 46 of the plasma process area P3.

As illustrated in FIG. 12, a side ring 100, which is a cover, is provided along the outer circumference of the turntable 2 and slightly below the turntable 2. First and second exhaust openings 610 and 620, which are apart from each other in the circumferential direction, are formed in the upper surface of the side ring 100. More specifically, the first and second exhaust openings 610 and 620 are formed in the side ring 100 at locations that correspond to exhaust ports formed in the bottom surface of the vacuum chamber 1.

Figure 14:
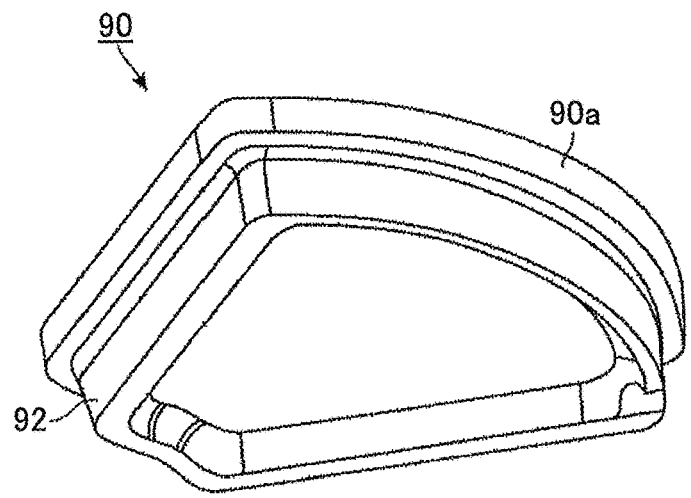
FIG. 14 is a perspective view of an example of a housing provided in a plasma generator of a film deposition apparatus according to an embodiment of the present disclosure.

FIG. 14 is a perspective view of an example of the housing 90 provided in the plasma generator 81 of the plasma generator 81 according to the present embodiment. As illustrated in FIG. 14, an upper peripheral part surrounding the entire circumference of the housing 90 extends horizontally to form the flange part 90a. Moreover, a central part of the housing 90 in a plan view is recessed toward the inner area of the vacuum chamber 1.

The housing 90 is arranged so as to extend across the diameter of the wafer W in the radial direction of the turntable 2 when the wafer W is located under the housing 90. A seal member 11c such as an O-ring is provided between the ring-shaped member 82 and the top plate 11.

The internal atmosphere of the vacuum chamber 1 is hermetically sealed by the ring-shaped member 82 and the housing 90. The ring-shaped member 82 and the housing 90 are placed in the opening 11a, and the entire circumference of the housing 90 is pressed downward via a frame-shaped pressing member 91 that is placed on the upper surfaces of the ring-shaped member 82 and the housing 90 and extends along a contact region between the ring-shaped member 82 and the housing 90. The pressing member 91 is fixed to the top plate 11 with, for example, bolts (not illustrated in the drawing). As a result, the internal atmosphere of the vacuum chamber 1 is sealed hermetically. In FIG. 13, a depiction of the ring-shaped member 82 is omitted for simplification.

As illustrated in FIG. 14, the housing 90 also includes a protrusion 92 that extends along the circumference of the housing 90 and protrudes vertically from the lower surface of the housing 90 toward the turntable 2. The protrusion 92 surrounds the second process region P2 below the housing 90. The process gas nozzles 61 through 63 are accommodated in a region surrounded by the inner circumferential surface of the protrusion 92, the lower surface of the housing 90, and the upper surface of the turntable 2. A part of the protrusion 92 near a base end (at the inner wall of the vacuum chamber 1) of each of the process gas nozzles 61 through 63 is cut off to form an arc-shaped cut-out that conforms to the outer shape of each of the process gas nozzles 61 through 63.

As illustrated in FIG. 12, on the lower side (i.e., the second process area P2) of the housing 90, the protrusion 92 is formed along the circumference of the housing 90. The protrusion 92 prevents the seal member 11c from being directly exposed to plasma, i.e., isolates the seal member 11c from the second process area P2. This causes plasma to pass through an area under the protrusion 92 even when plasma spreads from the second process area P2 toward the seal member 11c, thereby deactivating the plasma before reaching the seal member 11c.

Figure 15:
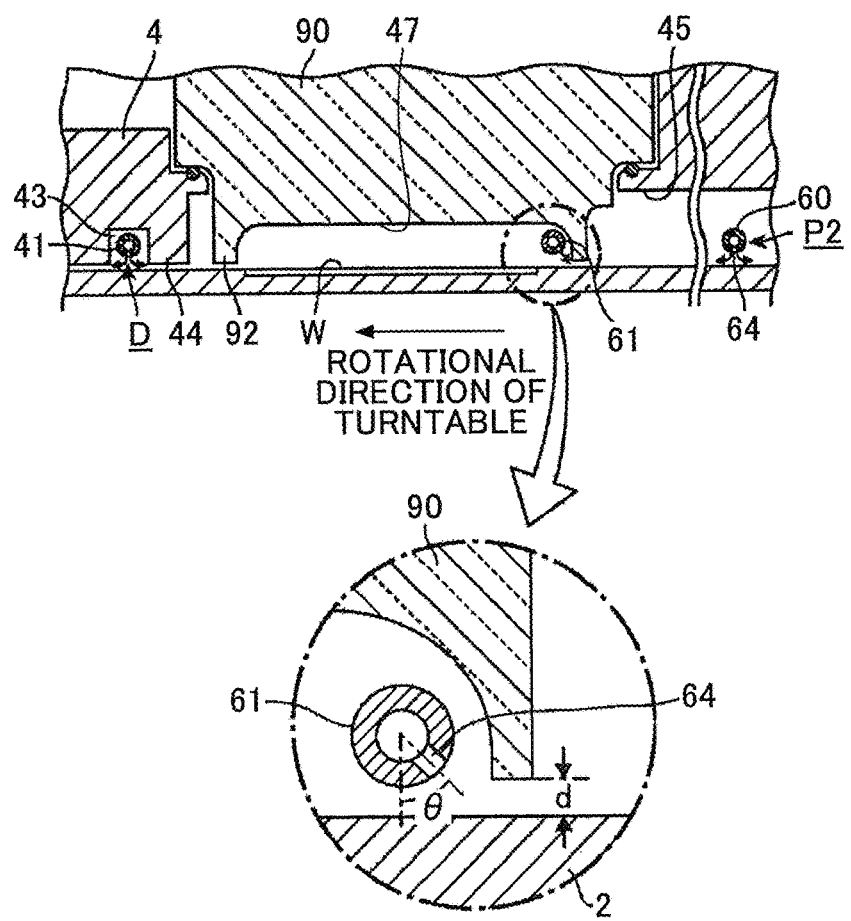
FIG. 15 is a vertical cross-sectional view taken along a rotational direction of a turntable in a film deposition apparatus according to an embodiment of the present disclosure.

FIG. 15 is a vertical cross-sectional view of the vacuum chamber 1 taken along the rotational direction of the turntable 2. As illustrated in FIG. 7, because the turntable 2 rotates in a clockwise fashion during the plasma process, $N_2$ gas is likely to intrude into an area under the housing 90 from a clearance between the turntable 2 and the protrusion 92 by being brought by the rotation of the turntable 2. To prevent $N_2$ gas from intruding into the area under the housing 90 through the clearance, a gas is discharged to the clearance from the area under the housing 90. More specifically, as illustrated in FIGS. 12 and 15, the gas discharge holes 64 of the process gas nozzle 61 are arranged to face the clearance, that is, to face the upstream side in the rotational direction of the turntable 2 and downward. A facing angle θ of the gas discharge holes 64 of the process gas nozzle 61 relative to the vertical axis may be, for example, about 45 degrees as illustrated in FIG. 15, or may be about 90 degrees so as to face the inner side wall of the protrusion 92. In other words, the facing angle θ of the gas discharge holes 36 may be set at an appropriate angle capable of properly preventing the intrusion of $N_2$ gas in a range from 45 to 90 degrees depending on the intended use.

Figure 16:
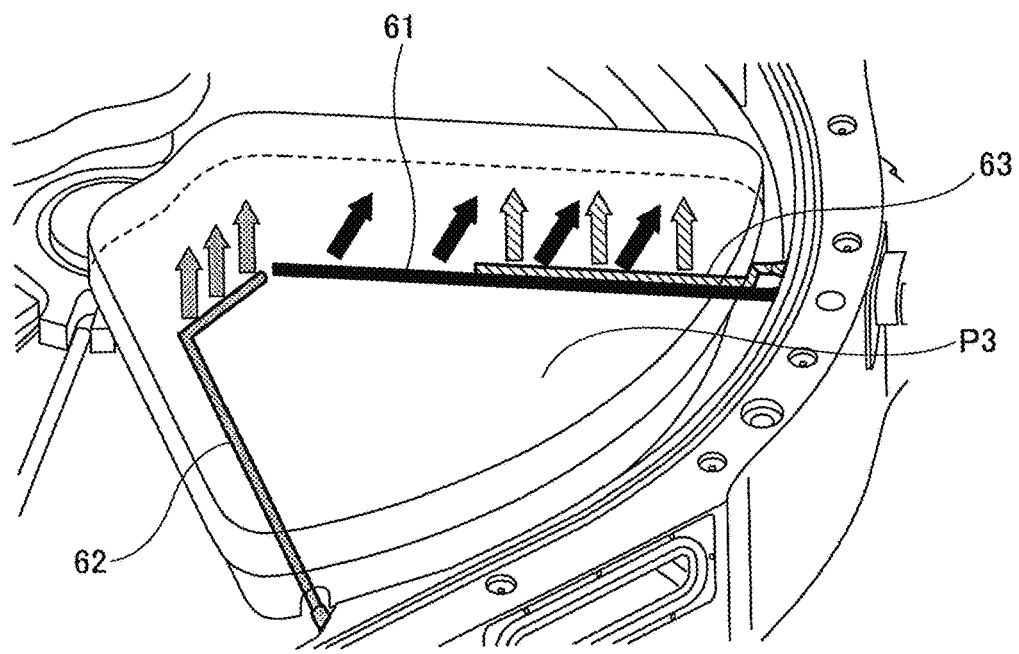
FIG. 16 is an enlarged perspective view of a process gas nozzle provided in a plasma treatment region in a film deposition apparatus according to an embodiment of the present disclosure.

FIG. 16 is an enlarged perspective view illustrating the process gas nozzles 61 through 63 provided in the plasma process region P2. As illustrated in FIG. 16, the process gas nozzle 61 is a nozzle capable of covering the whole of the concave portion 24 in which the wafer W is placed, and supplying a plasma processing gas to the entire surface of the wafer W. On the other hand, the process gas nozzle 63 is a nozzle provided slightly above the process gas nozzle 61 so as to approximately overlap with the process gas nozzle 61. The length of the process gas nozzle 62 is about half the length of the process gas nozzle 61. The process gas nozzle 62 extends from the outer peripheral wall of the vacuum chamber 1 along the radius of the downstream side of the sectorial plasma process region P2 in the rotational direction of the turntable 2, and has a shape bent linearly along the central area C after reaching the neighborhood of the central area C.

Hereinafter, for convenience of distinction, the process gas nozzle 61 covering the whole area may be referred to as a base nozzle 61, and the process gas nozzle 63 covering only the outer area may be referred to as an outer nozzle 63. Also, the process gas nozzle 62 extending to the inside may be referred to as an axis-side nozzle 62.

The base nozzle 61 is a gas nozzle for supplying a plasma processing gas to the whole surface of the wafer W. As illustrated in FIG. 15, the base gas nozzle 61 discharges the plasma processing gas toward the protrusion 92 forming the side surface separating the plasma process region P3 from the other area.

On the other hand, the outer nozzle 63 is a nozzle for supplying a plasma processing gas selectively to an outer area of the wafer W. The plasma processing gas supplied to the plasma process region P3 is converted to plasma by passing through the highest part of the plasma process region P3, which is also close to the plasma generator 81. More specifically, because the plasma generator 81 is provided above the plasma process region P3, the plasma processing gas flowing along a ceiling surface 47 (see FIG. 15) of the plasma process region P3 is converted to the plasma, which contributes to the plasma process. In other words, the neighborhood of the ceiling surface 47 of the plasma process region P3 forms a plasma generation area, and the plasma processing gas having passed the plasma generation area is properly converted to the plasma. The outer nozzle 63 performs a process of increasing a flow rate of a plasma processing gas supplied from the outer nozzle 63 and a flow speed of the plasma processing gas of an outer area when obtaining an amount of plasma processing performed on a film deposited on the wafer W after the plasma process and an result of the amount of plasma processing insufficient in the outer area. As the flow speed of the plasma processing gas increases, the amount of plasma processing gas converted to the plasma per unit time increases, which accelerates the plasma process. Accordingly, based on this perspective, the gas discharge holes 64 (not illustrated in the drawings) of the outer nozzle 63 are provided to face upward and the ceiling surface 47 of the Plasma process region P3, and are configured to lead the supplied plasma processing gas to the ceiling surface 47 of the plasma process region P3.

The axis-side nozzle 62 is a nozzle for supplying a plasma processing gas selectively to an area near the axis of the turntable 2 of the wafer W. Hence, the gas discharge holes 64 (not illustrated in the drawings) are formed only in a part of the tip of the axis-side nozzle 62 extending along the central area C, and are configured to supply the plasma processing gas to the area near the axis of the turntable 2 of the wafer W. In the axis-side nozzle 62, the gas discharge holes 64 also face upward and are provided at a location facing the ceiling surface 47 of the plasma process region P3. This causes the plasma processing gas supplied from the axis-side nozzle 62 to immediately flow toward the plasma generation area and to be converted to plasma efficiently. In the event that an insufficient plasma process on the wafer W in the area near the axis of the turntable 2 is found when obtaining a processing distribution within a surface of a film on the wafer W after the plasma process, by increasing a flow rate and a flow speed of the plasma processing gas supplied from the axis-side nozzle 62, the plasma process on the wafer W in the area near the axis of the turntable 2 can be urged.

In this manner, by providing the outer nozzle 63 and the axis-side nozzle 62 in addition to the base nozzle 33, the flow speed of the plasma processing gas can be adjusted for each area, which makes it possible to adjust the amount of processing on a film on the wafer W across its surface.

The adjustment of the amount of processing across the surface of the wafer W is generally performed to improve a uniformity of the plasma process across the surface of the wafer W, but when making a difference of the amount of plasma processing for each area is desired, the purpose can be implemented by increasing the flow rate of the plasma processing gas supplied from the nozzles 63 and 62 to the target region expected to be processed more so as to increase the flow speed. Accordingly, in addition to the improvement of the process uniformity across the surface of the wafer W, a variety of adjustments of the amount of processing is possible.

Furthermore, because the flow rate of the outer nozzle 63 and the axis-side nozzle 62 are relative to each other, the adjustment of decreasing the flow rate of the plasma processing gas from the plasma processing nozzles 63 and 62 to an area expected to be processed less is naturally possible.

In this manner, by providing the process gas nozzles 63 and 62 for flow rate adjustment for each area, the adjustment of the amount of plasma processing within the surface can be performed readily and accurately. In FIG. 16, although an example of including three of the process gas nozzles 61 through 63 is illustrated, the adjustment of the amount of processing within the surface may be performed more finely and accurately by installing more process gas nozzles. The number, a shape, an installation location and the like of the process gas nozzles 61 through 63 can be changed depending on the intended use.

Next, a Faraday shield 95 of the plasma generator 81 is described below in detail. FIG. 13 is an exploded perspective view of an example of the plasma generator 81 in the film deposition apparatus according to an embodiment of the present disclosure. As illustrated in FIGS. 12 and 13, a Faraday shield 95 is provided on the upper side of the housing 90. The Faraday shield 95 is grounded, and is composed of a conductive plate-like part such as a metal plate (e.g., copper plate) that is shaped to roughly conform to the internal shape of the housing 90. The Faraday shield 95 includes a horizontal surface 95a that extends horizontally along the bottom surface of the housing 90, and a vertical surface 95b that extends upward from the outer edge of the horizontal surface 95a and surrounds the horizontal surface 95a. The Faraday shield 95 may be configured to be, for example, a substantially hexagonal shape in a plan view.

Figure 17:
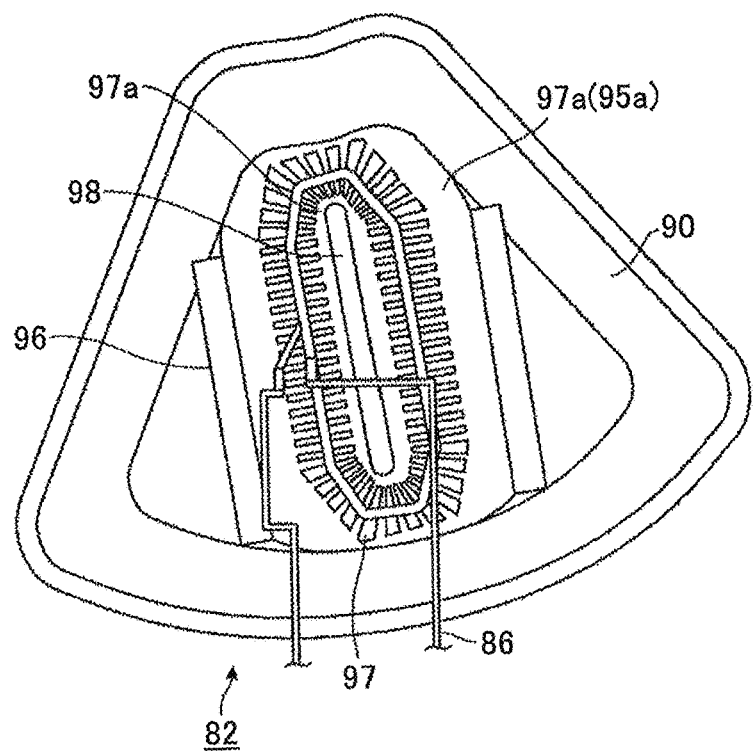
FIG. 17 is a plan view of an example of a plasma generator in a film deposition apparatus according to an embodiment of the present disclosure.
Figure 18:
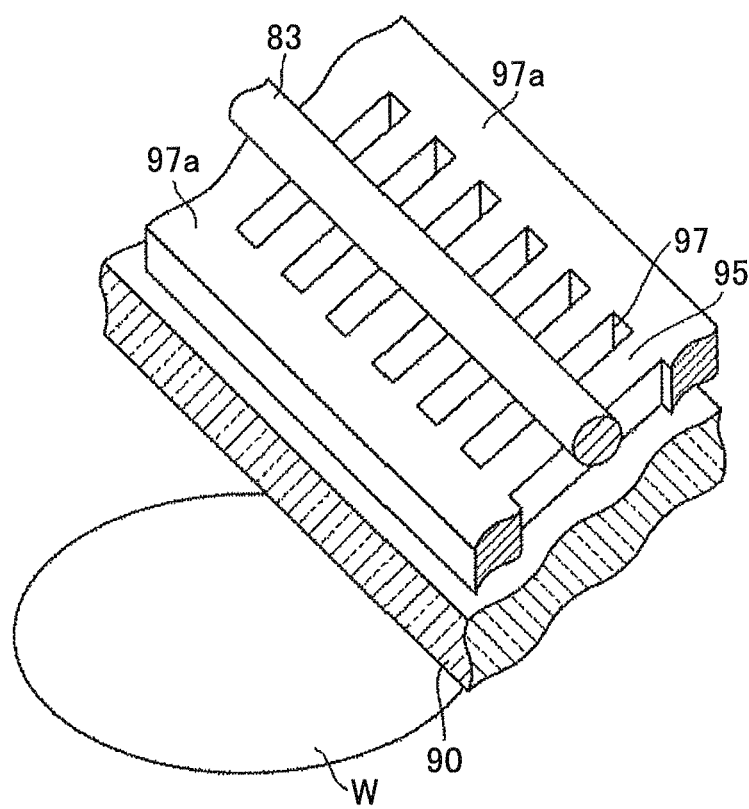
FIG. 18 is a partial perspective view of a Faraday shield provided in a plasma generator in a film deposition apparatus according to an embodiment of the present disclosure.

FIG. 17 is a plan view of an example of the plasma generator 81. FIG. 18 is a perspective view of a part of the Faraday shield 95 provided in the plasma generator 81.

When seen from the rotational center of the turntable 2, the right and left upper ends of the Faraday shield 95 extend horizontally rightward and leftward, respectively, to form supports 96. A frame 99 is provided between the Faraday shield 95 and the housing 90 to support the supports 96 from below. The frame 99 is supported by a part of the housing 90 near the central area C and a part of the flange part 90a near the outer edge of the turntable 2.

When an electric field reaches the wafer W, for example, electric wiring and the like formed inside the wafer W may be electrically damaged. To prevent this problem, as illustrated in FIG. 18, a plurality of slits 97 is formed in the horizontal surface 95a. The slits 97 prevent an electric-field component of an electric field and a magnetic field (electromagnetic field) generated by the antenna 83 from reaching the wafer W below the Faraday shield 95, and allow a magnetic field component of the electromagnetic field to reach the wafer W.

As illustrated in FIGS. 17 and 18, the slits 97 extend in directions that are orthogonal to the direction in which the antenna 83 is wound, and are arranged to form a circle below the antenna 83. The width of each slit 97 is set at a value that is about 1/10000 or less of the wavelength of radio frequency power supplied to the antenna 83. Circular electrically-conducting paths 97a made of, for example, a grounded conductor are provided at the ends in the length direction of the slits 97 to close the open ends of the slits 97. An opening 98 is formed in an area of the Faraday shield 95 where the slits 97 are not formed, i.e., an area surrounded by the antenna 83. The opening 98 is used to check whether plasma is emitting light. In FIG. 3, the slits 97 are omitted for simplification, but an area where the slits 97 are formed is indicated by a dashed-dotted line.

As illustrated in FIG. 13, an insulating plate 94 is stacked on the horizontal surface 95a of the Faraday shield 95. The insulating plate 94 is made of, for example, quartz having a thickness of about 2 mm, and is used for insulation between the Faraday shield 95 and the plasma generator 81 disposed above the Faraday shield 95. Thus, the plasma generator 81 is arranged to cover the inside of the vacuum chamber 1 (i.e., the wafer W on the turntable 2) through the housing 90, the Faraday shield 95, and the insulating plate 94. In the present embodiment, the plasma generator 81 is not a required element, but may be provided as necessary. Moreover, even when the plasma generator 81 is provided, the plasma generator 81 is not limited to the configuration including three process gas nozzles 61 through 63, but may be configured to include only a single process gas nozzle 61 as illustrated in FIGS. 2 and 3.

[Film Deposition Method]

Next, a film deposition method according to an embodiment of the present invention is described below by citing an example of using the above-mentioned film deposition apparatus. Thus, the drawings used to explain the above-mentioned film deposition apparatus are referred to again as necessary.

First, a gate valve (not illustrated in the drawings) is opened and the wafers W are transferred to the concave portions 24 of the turntable 2 via the transfer port 15 (FIG. 2 and FIG. 3) by the transfer arm 10 (FIG. 3) from the outside. The turntable 2 is configured to be able to move up and down. Before the wafers W are carried into/out of the vacuum chamber 1, the turntable 2 moves down to a predetermined low position, and the transfer of the wafers W is performed while the turntable 2 is in the predetermined low position. Before the wafers W are processed, the turntable 2 moves up to a predetermined high position. The wafers W are processed while the turntable 2 is in the predetermined high position. Hence, the transfer of the wafers W is performed in a state where the turntable 2 is already in the predetermined low position. The controller 100 may move the turntable 2 down by controlling a lifting mechanism (not illustrated in the drawings). This transfer is performed by lifting the lift pins (not illustrated in the drawings) via through holes provided in the bottom surface of the concave portion 24 from the bottom portion side of the vacuum chamber 1 when the concave portion 24 stops at a position facing the transfer port 15. By repeating such a wafer transfer while intermittently rotating the turntable 2, each of the wafers W are loaded into the concave portions 24. When the wafer W is placed on the concave portion 24 of the turntable 2, the wafer W could warp because of the temperature difference between the inside and outside of the vacuum chamber 1. However, because the turntable 2 is set at the predetermined low position to make a space above the turntable 2, the plurality of wafers W is sequentially placed on the concave portions 24 while intermittently rotating the turntable 2 without waiting for the warpage of the wafer W to decrease. After the placement of all of the wafers W on the turntable 2 is finished and the warpage of the wafers W is sufficiently decreased, the controller 100 moves the turntable 2 up by controlling the lifting mechanism (not illustrated in the drawings) and stops the turntable 2 at the predetermined high position that is appropriate to perform the substrate process.

Then, the gate valve is closed, and the vacuum chamber 1 is evacuated by the vacuum pump 640 to the attainable degree of vacuum. Then, Ar gas or $N_2$ gas as a separation gas is discharged from the separation gas nozzles 41 and 42 at a predetermined flow rate. At this time, Ar gas or $N_2$ gas is also discharged from the separation gas supplying pipe 51 and the purge gas supplying pipes 72 and 73 at a predetermined flow rate, respectively. With this, the automatic pressure controllers 650 control the inside of the vacuum chamber 1 to a preset process pressure and set the exhaust pressures such that the first exhaust opening 610 and the second exhaust opening 620 have an appropriate pressure difference therebetween. As discussed above, the appropriate pressure difference is set depending on the preset pressure of the inside of the vacuum pressure 1.

Subsequently, the wafers W are heated to, for example, 400 degrees C. by the heater unit 7 while rotating the turntable 2 in a clockwise fashion at a rotational speed of, for example, 5 rpm.

Next, the showerhead 30 and the process gas nozzle 60 discharge a source gas such as a Si-containing gas and a reaction gas (oxidation gas) such as $O_3$ gas, respectively (see FIG. 2 and FIG. 3). Here, the source gas supply part 32 of the showerhead 30 supplies the Si-containing gas together with a carrier gas such as Ar, but each of the axial-side supplementary gas supply part 33 and the peripheral-side supplementary gas supply part 34 may supply only a carrier gas such as Ar gas or may supply a mixed gas of the Si-containing gas and Ar gas at a mixture ratio different from that of the source gas supply part 32. Thus, the concentration of the source gas on the axial side and the peripheral side can be adjusted, which can improve the uniformity across the surface of the wafer W. Moreover, because the axial-side supplementary gas supply part 33 and the peripheral-side supplementary gas supply part 34 have the longer distance d2, d3 from the turntable 2 than that (d1) of the source gas supply part 32, the supplementary gases are supplied without preventing the flow of the source gas from the source gas supply part 32. The flow rate of source gas may be set at 30 sccm or lower, for example, at about 10 sccm. Moreover, as discussed above, only the axial-side supplementary gas supply part 33 is provided, and only the axial-side supplementary gas supply part 33 may supply the supplementary gas.

When necessary, the process gas nozzle 61 through 63 may supply a mixed gas of Ar gas, $O_2$ gas and $H_2$ gas mixed at a predetermined flow ratio into the vacuum chamber 1, and the radio frequency power source 85 may supply radio frequency power of, for example, 700 W to the antenna 83 in the plasma generator 81. Thus, plasma is generated, and the deposited film can be treated with the plasma.

While the turntable 2 rotates one revolution, a silicon oxide film is deposited on a wafer W as described below. First, when the wafer W passes through the first process region P1 below the bottom plate 31 of the showerhead 30, a Si-containing gas adsorbs on a surface of the wafer W. The Si-containing gas may be, for example, an organic aminosilane gas. Next, when the wafer W passes through the second process region P2 below the process gas nozzle 60, the Si-containing gas adsorbed on the wafer W is oxidized by $O_3$ gas, and thereby one molecular layer (or a couple of molecular layers) of silicon oxide is formed. Next, when the wafer W passes through the region under the plasma generator 81, the silicon oxide layer on the wafer W is exposed to an activated gas that contains oxygen radicals. Reactive oxygen species such as oxygen radicals, for example, serve to release an organic substance originally contained in the Si-containing gas and then remaining in the silicon oxide layer, from the silicon oxide layer by oxidizing the organic substance. Thus, the silicon oxide layer can be highly purified.

After rotating the turntable 2 a number of times needed to form the silicon oxide film up to a predetermined film thickness, the film deposition is stopped by stopping the supply of the Si-containing gas, the supplementary gas, $O_3$ gas, and the mixed gas for plasma treatment containing Ar gas and $O_2$ gas that are supplied as necessary. Subsequently, the supply of Ar gas from the separation gas nozzles 41 and 42, the separation gas supply pipe 51 and the purge gas supply pipes 72 and 73 is stopped, and the rotation of the turntable 2 is also stopped. After that, the wafers W are carried out of the vacuum chamber 1 by a procedure reverse to the procedure for carrying the wafers W into the vacuum chamber 1.

In the present embodiment, an example has been explained of using the silicon-containing gas as the source gas and the oxidation gas as the reaction gas, but a combination of the source gas and the reaction gas can be varied depending on the intended use. For example, a silicon nitride film may be deposited by using a silicon-containing gas as the source gas and a nitriding gas as the reaction gas. Moreover, a titanium nitride film may be deposited by using a titanium-containing gas as the source gas and a nitriding gas as the reaction gas. Thus, the source gas can be selected from a variety of gases such as organic metal gas, and a variety of reaction gases can be used as long as the reaction gas can react with the source gas and produce a reaction product, such as the nitriding gas.

[Simulation Result]

Next, results of simulation experiments where the film deposition apparatus and the film deposition method according to an embodiment of the present disclosure are performed, are described below. The same numerals are used for elements corresponding to the elements described in the above-mentioned embodiments for easy understanding, and the description about the same elements is omitted. The film deposition apparatus simulated in the experiments has the same configuration as that of the above-mentioned embodiments, and the film deposition apparatus has the showerhead 30 including all of the source gas supply part 32, the axial-side supplementary gas supply part 33 and the peripheral-side supplementary gas supply part 34. The distance d1 between the source gas supply part 32 and the turntable 2 is set at 1.5 mm, and the distance d3 between the axial-side supplementary gas supply part 33 and the turntable 2 and the distance d2 between the peripheral-side supplementary gas supply part 34 and the turntable 2 are set at 3 mm. Moreover, the distance between the high bottom surface region 31b of the bottom plate 32 in the showerhead 30 and the turntable 2 is also set at 3 mm.

Figure 19A:
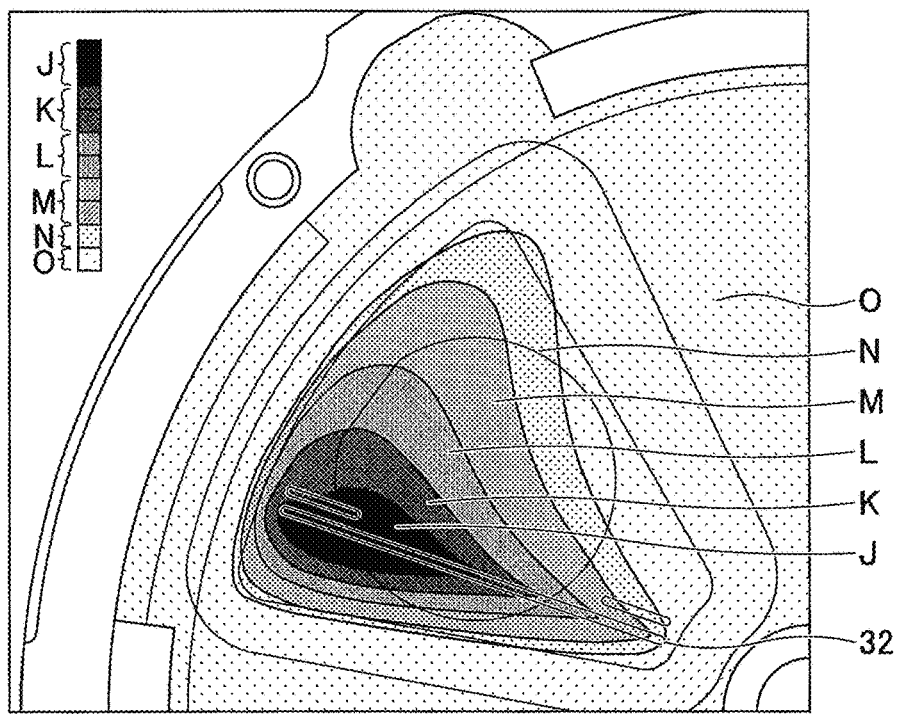
FIGS. 19A and 19B are diagrams showing film deposition results of a simulation experiment 1.
Figure 19B:
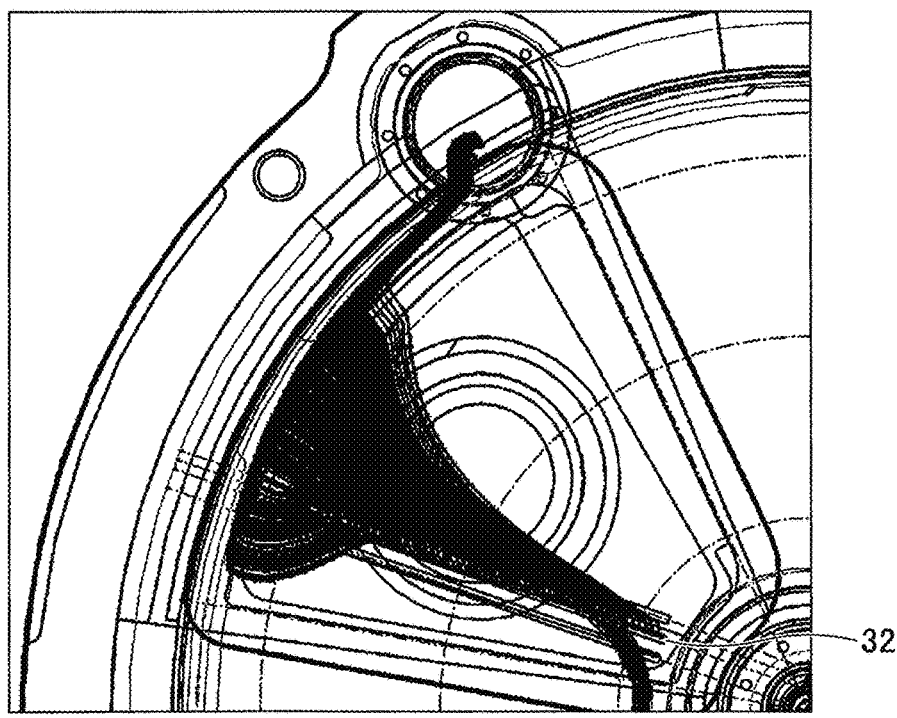

FIGS. 19A and 19B are diagrams showing a film deposition result of a simulation experiment 1. In the simulation experiment 1, the pressure in the vacuum chamber 1 is set at 2 Torr, and each of the exhaust pressures of the exhaust openings 610 and 620 is set at 50 Torr. The temperature of the wafer W is set at 400 degrees C. The rotational speed of the turntable 2 is set at 5 rpm. The source gas supply part 32 supplies an organic aminosilane gas at a flow rate of 10 sccm. Each of the axial-side supplementary gas supply part 33 and the peripheral-side supplementary gas supply part 34 supplies Ar gas at a flow rate of 5 sccm. The process gas nozzle 60 supplies $O_3$ gas at a flow rate of 500 sccm. Each of the separation gas nozzles 41 and 42 supplies Ar gas at a flow rate of 5 slm. The separation gas pipe 51 provided above the axis supplies Ar gas at a flow rate of 1 slm, and the purge gas supply pipe 72 provided below the axis supplies Ar gas at a flow rate of 3 slm. In the plasma process region P3, the base nozzle 61 supplies Ar gas at a flow rate of 14.8 slm and $O_2$ gas at a flow rate of 75 sccm. The axial-side nozzle 62 supplies Ar gas at a flow rate of 14.8 slm, and also $O_2$ gas at a flow rate of 75 sccm. Furthermore, the axial-side nozzle 62 supplies Ar gas at a flow rate of 0.1 slm, and the peripheral-side nozzle 63 supplies Ar gas at a flow rate of 0.1 slm.

FIG. 19A is a diagram showing concentration distribution of the source gas. In FIG. 19A, a region in which a concentration of the source gas is 50% or more is made a saturated reference region (full scale region), and regions having lower concentration than the saturated reference concentration are classified into ranks having predetermined concentration ranges, thereby indicating the concentration distribution of the source gas. The ranks are classified into six ranks and labeled with J, K, L, M, N and O in the decreasing order of the concentration.

In FIG. 19A, the concentration proportionally changes along the circumferential direction from the source gas supply part 32, which shows preferable concentration distribution characteristics.

FIG. 19B is a diagram showing an analysis result of a trajectory of flows of the source gas in the simulation experiment 1. FIG. 19B indicates that the source gas flows along the circumferential direction and is supplied almost uniformly in the radial direction of the turntable 2.

Thus, the analysis result indicates that the film deposition using the film deposition apparatus according to the present embodiment can make the source gas distribution uniform and can improve the film thickness uniformity across the surface of the wafer W.

Figure 20A:
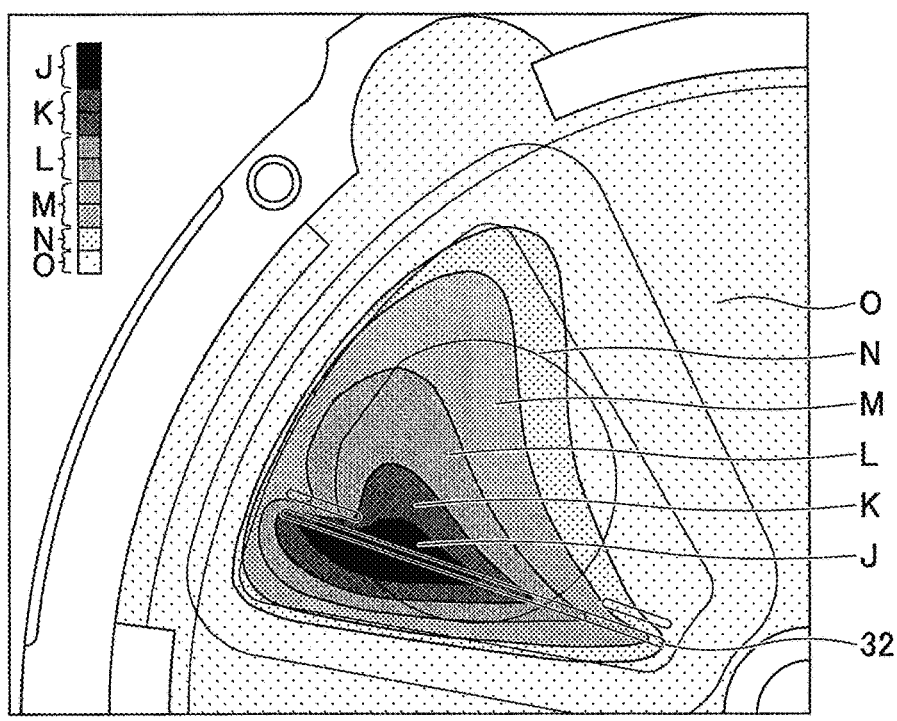
FIGS. 20A and 20B are diagrams showing analysis results of a simulation experiment 2.
Figure 20B:
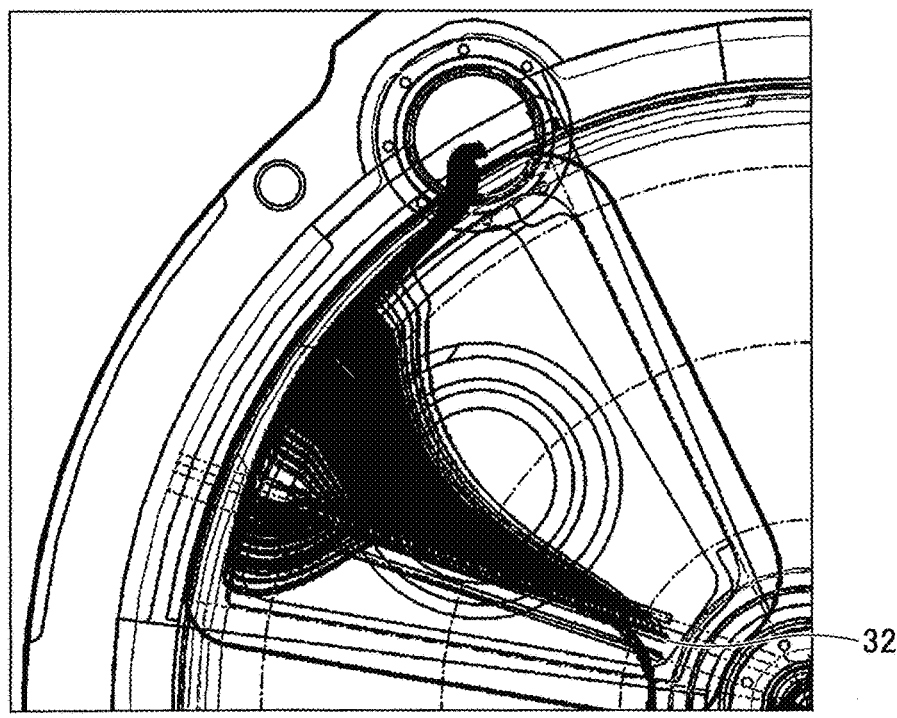

FIGS. 20A and 20B are diagrams showing analysis results of simulation experiment 2. In the simulation experiment 2, the same film deposition apparatus as the experiment 1 is used, and the flow rate of Ar gas from each of the axial-side supplementary gas supply part 33 and the peripheral-side gas supply part 34 is increased to 10 sccm. The flow rate of the organic aminosilane gas from the source gas supply part 32 is 10 sccm, which is the same as the experiment 1. The other conditions are the same as the experiment 1.

FIG. 20A is a diagram showing an analysis result of concentration distribution of the source gas in the simulation experiment 2. In FIG. 20A, an indication method is the same as FIG. 19A. FIG. 20A shows preferable concentration distribution of the source gas in which the concentration proportionally distributes along the circumferential direction.

FIG. 20B is a diagram showing an analysis result of a trajectory of flows of the source gas in the simulation experiment 2. In FIG. 20B, the source gas on the peripheral side moves toward the left side of the source gas supply part 32, which means that some flows move toward the upstream side in the rotational direction of the turntable 2, and that some reverse flows are generated. Although the flows in FIG. 20B are preferable as a whole, the flows of the source gas are not as uniform as the flows in FIG. 19B. Thus, by changing the flow rates of the supplementary gas of the axial-side supplementary gas supply part 33 and the peripheral-side supplementary gas supply part 34, a direction and distribution of the source gas can be changed.

Figure 21A:
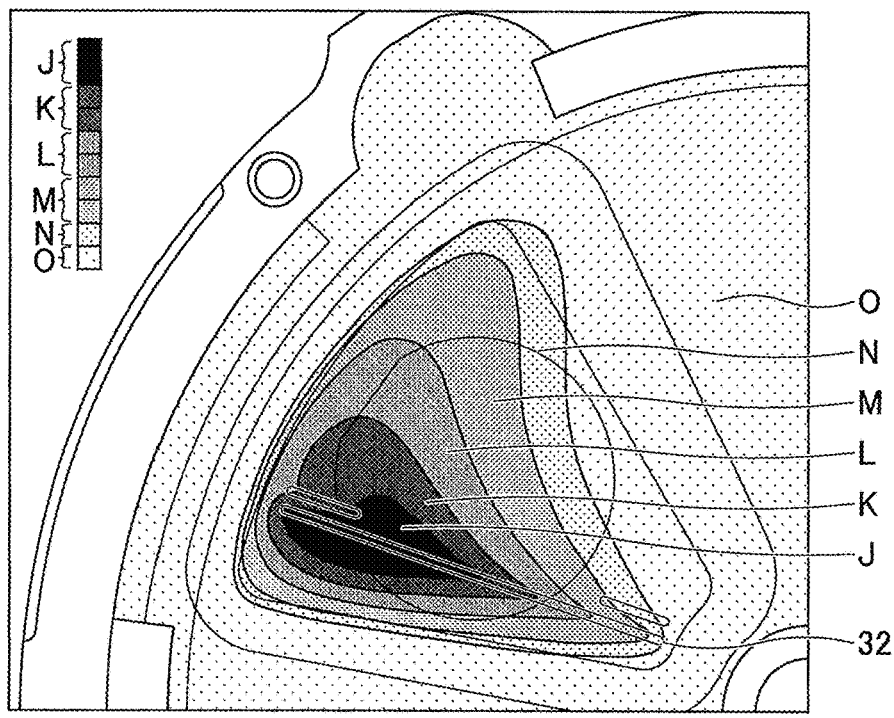
FIGS. 21A and 21B are diagrams showing analysis results of a simulation experiment 3.
Figure 21B:
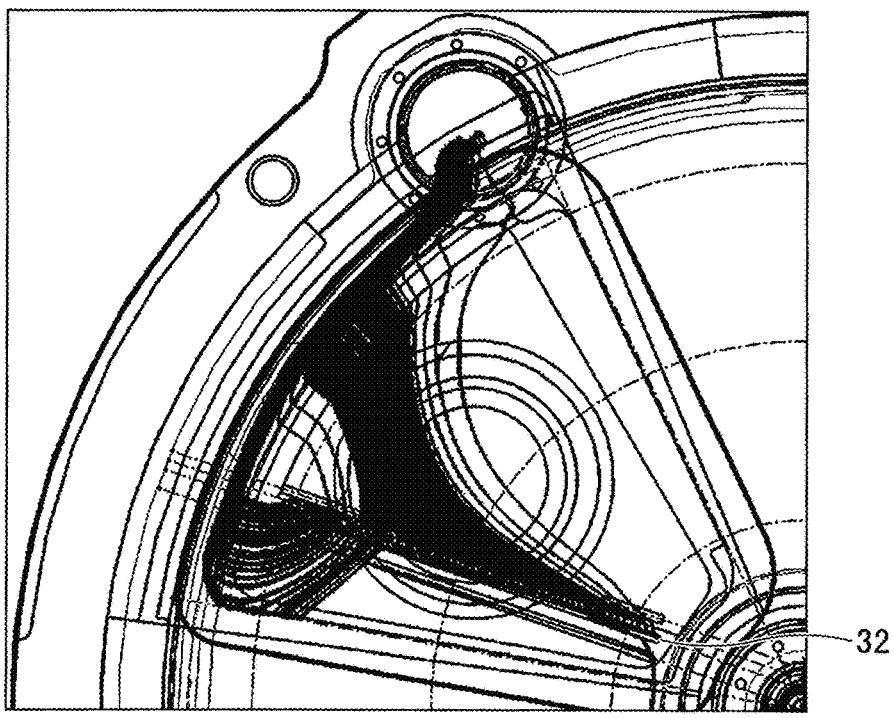

FIGS. 21A and 21B are diagrams showing analysis results of simulation experiment 3. In the simulation experiment 3, the same film deposition apparatus as the experiments 1 and 2 is used, and the flow rate of Ar gas from each of the axial-side supplementary gas supply part 33 and the peripheral-side gas supply part 34 is increased to 20 sccm. The flow rate of the organic aminosilane gas from the source gas supply part 32 is 10 sccm, which is the same as the experiments 1 and 2. The other conditions are the same as the experiments 1 and 2.

FIG. 21A is a diagram showing an analysis result of concentration distribution of the source gas in the simulation experiment 3. In FIG. 21A, the concentration of the source gas does not necessarily proportionally contribute along the circumferential direction, and a disproportion occurs in concentration distribution.

FIG. 21B is a diagram showing an analysis result of a trajectory of flows of the source gas in the simulation experiment 3. In FIG. 21B, the source gas on the peripheral side moves toward the left side of the source gas supply part 32, which means that more flows move toward the upstream side in the rotational direction of the turntable 2 than FIG. 20B, and that more reverse flows are generated than FIG. 20B. That is, FIG. 21B shows more disproportional flows of the source gas more than FIG. 20B. Thus, FIGS. 20B and 21B indicate that the direction and distribution of the source gas can be changed by changing the flow rates of the axial-side supplementary gas supply part 33 and the peripheral-side supplementary gas supply part 34.

Figure 22:
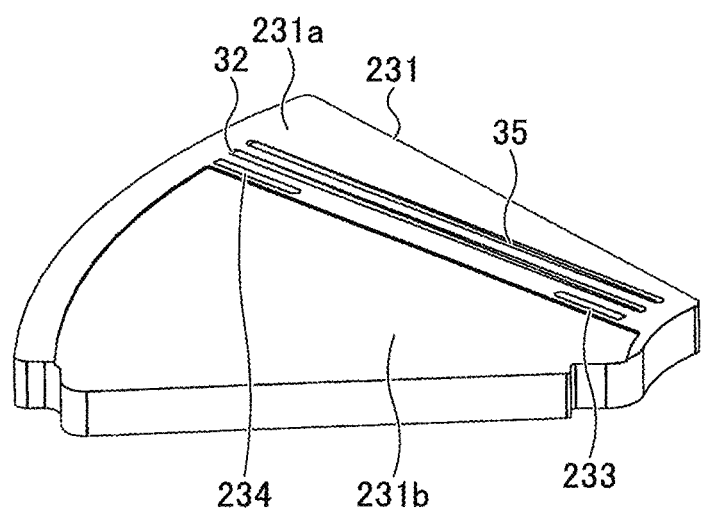
FIG. 22 is a diagram showing a configuration of a lower surface of a bottom plate of a showerhead in a film deposition apparatus used for a simulation experiment 4.

FIG. 22 is a diagram showing a configuration of a bottom surface (lower surface) of a bottom plate 231 of a showerhead of a film deposition apparatus used in a simulation experiment 4. In the film deposition apparatus of the simulation experiment 4, the source gas supply part 32, the axial-side supplementary gas supply part 33 and the peripheral-side gas supplementary gas supply part 34 was made the same, and the distance from the turntable 2 was all set at 1.5 mm that is the same as that of the source gas supply part 32.

Figure 23A:
FIGS. 23A and 23B are diagrams showing analysis results of the simulation experiment 4.
Figure 23B:
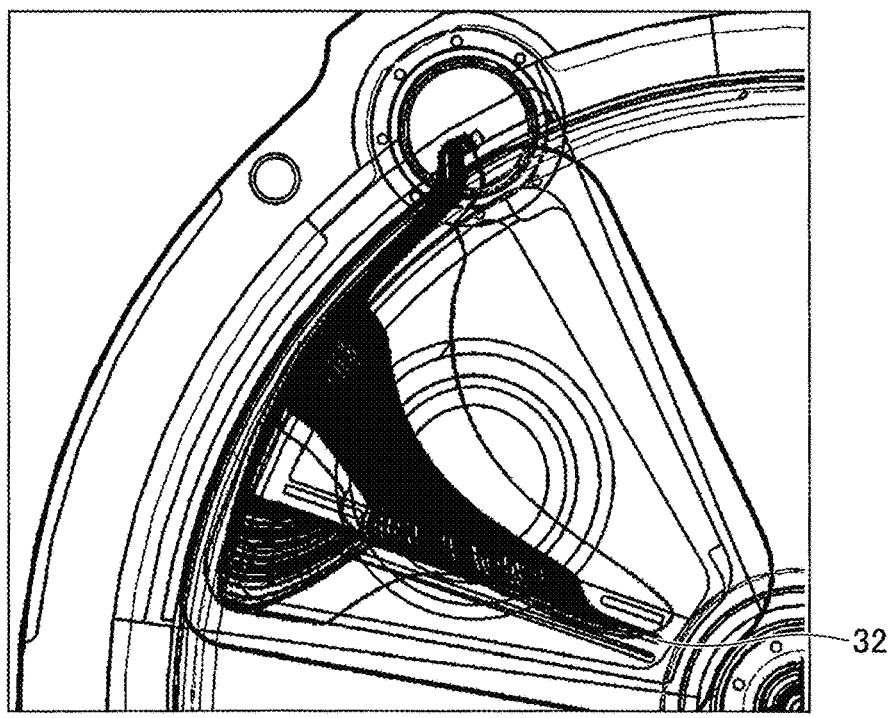

FIGS. 23A and 23B are diagrams showing analysis results of simulation experiment 4. In the simulation experiment 4, a film deposition apparatus including the showerhead that has the bottom plate 231 illustrated in FIG. 22 is used, and the flow rate of Ar gas from each of the axial-side supplementary gas supply part 33 and the peripheral-side gas supply part 34 is set at 10 sccm, which is the same setting as the experiment 2. The flow rate of the organic aminosilane gas from the source gas supply part 32 is 10 sccm, which is the same as the experiments 1 through 3. The other conditions are the same as the experiments 1 through 3.

FIG. 23A is a diagram showing an analysis result of concentration distribution of the source gas in the simulation experiment 4. In FIG. 23A, the concentration of the source gas does not necessarily proportionally distribute along the circumferential direction, and a disproportion occurs in concentration distribution.

FIG. 23B is a diagram showing an analysis result of a trajectory of flows of the source gas in the simulation experiment 4. In FIG. 23B, the source gas on the peripheral side moves toward the left side of the source gas supply part 32, which means that more flows move toward the upstream side in the rotational direction of the turntable 2 than FIG. 20B, and that more reverse flows are generated than FIG. 20B under the same conditions. That is, FIG. 23B shows more disproportional flows of the source gas than FIG. 20B. Thus, FIG. 23B indicates that uniformity of source gas supply decreases when the height of the axial-side supplementary gas supply part 33 and the peripheral-side supplementary gas supply part 34 is made the same as that of the source gas supply part 32, and the distance from the turntable 2 was made the same as each other.

Working Examples

Figure 24:
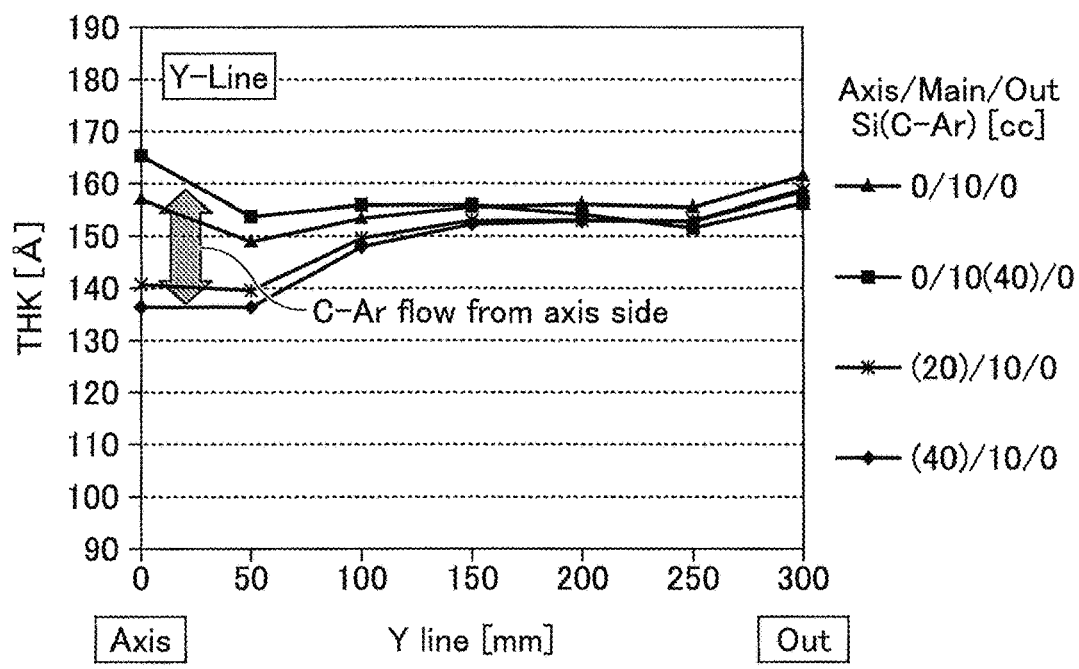
FIG. 24 is a diagram showing a result of a working example 1 of a film deposition process using a film deposition apparatus according to an embodiment of the present disclosure.

FIG. 24 is a diagram, showing a result of a working example 1. In the working example 1, a flow rate of an aminosilane gas that was a source gas from the source gas supply part 32 was set at a constant value of 10 sccm, and a flow rate of Ar gas from the axial-side supplementary gas supplementary part 33 was varied to various values. The peripheral-side supplementary gas supply part 34 did not supply any gas.

In the working example 1, the temperature of the wafer W was set at 400 degrees C., and the pressure in the vacuum chamber 1 was set at 2.0 Torr. The rotational speed of the turntable 2 was set at 5 rpm. The output of the radio frequency power source 85 for plasma was set at 4 kW. The process gas nozzle 60 supplied a mixed gas of $O_3/O_2$ as the oxidation gas. The flow rate of $O_3$ gas was set at 300 $g/m^3$, and the flow rate of $O_2$ gas was set at 6000 sccm.

In the working example 1, the flow rate of Ar gas from the axial-side supplementary gas supply part 33 was varied to 0 sccm, 20 sccm and 40 sccm. When the flow rate of Ar gas from the axial-side supplementary gas supply part 33 was set at 0 sccm, two examples of supplying only the source gas from the source gas supply part 32 and supplying a mixed gas of the source gas and Ar gas at a flow rate of 40 sccm are performed.

In FIG. 24, the horizontal axis is a Y coordinate (a coordinate along the radial direction of the turntable 2), and the vertical axis shows a film thickness (A). As shown in FIG. 24, the flow rate of Ar gas from the axial-side supplementary gas supply part 33 increases, the film thickness on the axial side decreases. This means that the concentration of the source gas on the axial side decreases, and that the film thickness decreases as a result of the supply of Ar gas to the axial side. Thus, FIG. 24 indicates that the control of reducing the film thickness on the axial side can be achieved by supplying Ar gas from the axial-side supplementary gas supply part 33.

Figure 25:
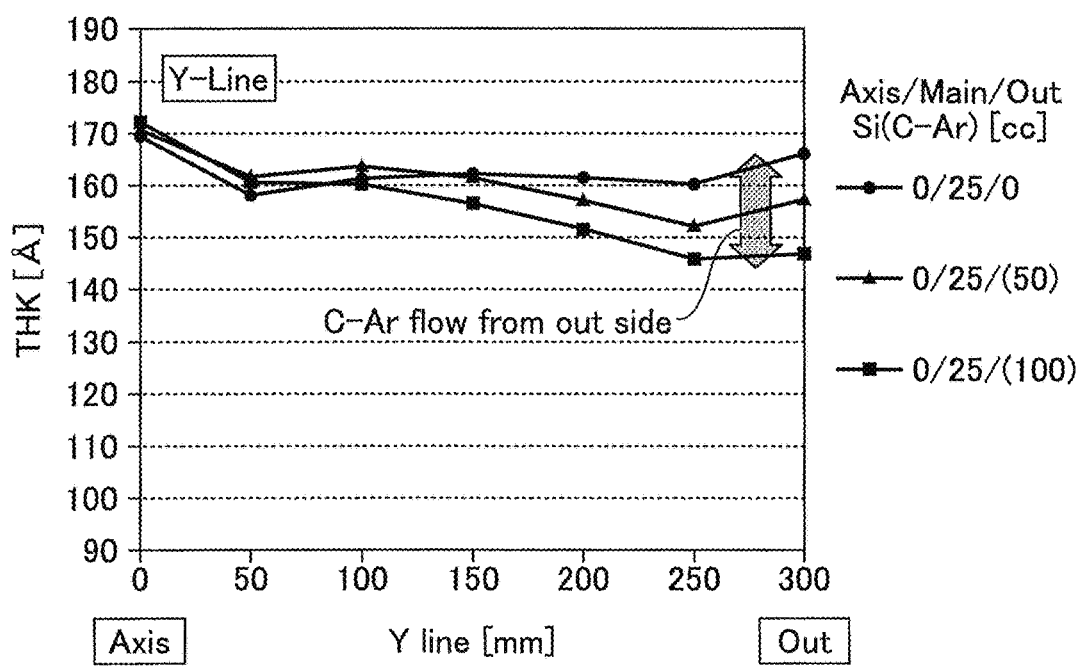
FIG. 25 is a diagram showing a result of a working example 2 of a film deposition process using a film deposition apparatus according to an embodiment of the present disclosure.

FIG. 25 is a diagram showing a result of a working example 2 in which film deposition was performed according to an embodiment of the present disclosure. In the working example 2, an aminosilane gas that is a source gas from the source gas supply part 32 was set at a constant flow rate of 25 sccm, and Ar gas from the peripheral-side supplementary gas supply part 34 was varied to various values. The axial-side supplementary gas supply part 33 did not supply any gas. The other conditions are the same as those of the working example 1.

In the working example 2, the flow rate of Ar from the peripheral-side supplementary gas supply part 34 was varied to 0 sccm, 50 sccm, and 100 sccm.

As shown in FIG. 25, the film thickness on the peripheral side decreases as the flow rate of Ar gas from the peripheral-side supplementary gas supply part 34 increases. This means that the concentration of the source gas on the peripheral side decreased and thereby that the film thickness decreased as Ar gas was supplied to the peripheral side.

Figure 26A:
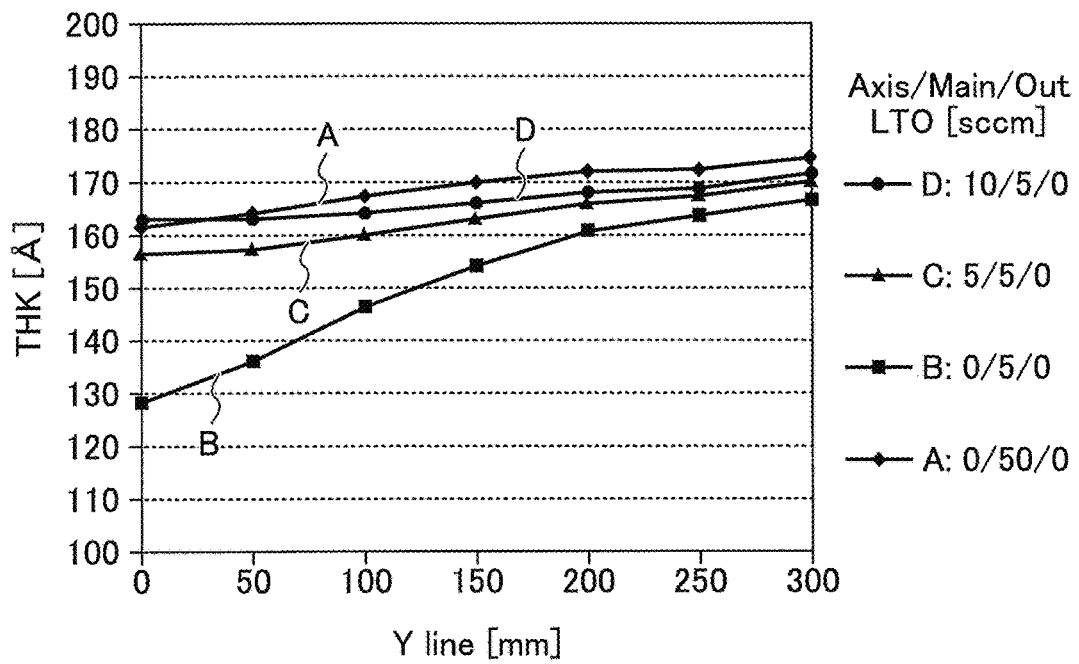
FIGS. 26A and 26B are diagrams showing results of a working example 3 of a film deposition process using a film deposition apparatus according to an embodiment of the present disclosure.
Figure 26B:
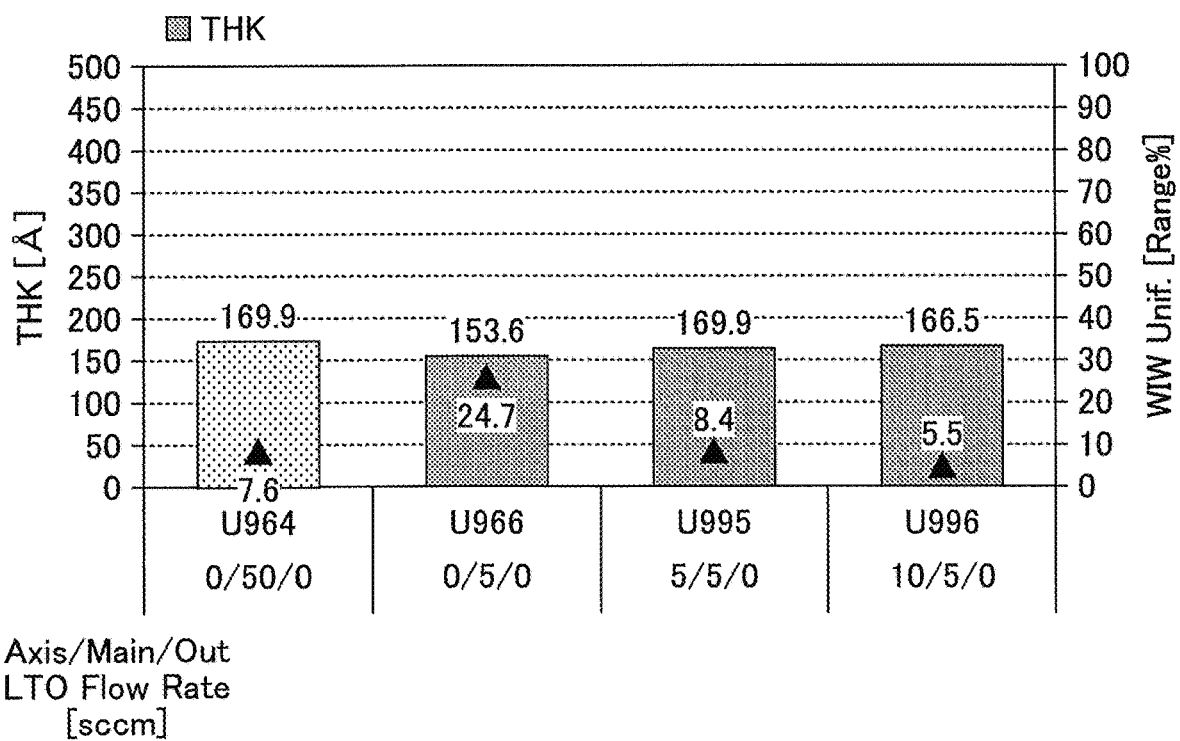

FIGS. 26A and 26B are diagrams showing results of a working example 3 in which film deposition was performed using the film deposition apparatus according to an embodiment of the present invention. In the working example 3, the flow rate of the source gas from the source gas supply part 32 was set at a constant value of 5 sccm. The axial-side supplementary gas supply part 33 supplied an aminosilane gas that is the source gas, and the flow rate was varied to 0 sccm, 5 sccm and 10 sccm, which are indicated by A to D in FIG. 26A. The peripheral-side supplementary gas supply part 34 did not supply a supplementary gas. Moreover, when the flow rate of the source gas from the axial-side supplementary gas supply part 33 was 0 sccm, an example of setting the flow rate of the source gas from the source gas supply part 32 at 50 sccm that was ten times as much as the other examples, was also performed.

FIG. 26A is a diagram showing concentration distribution in a Y axis. As shown in FIG. 26A, as the flow rate of the source gas supplied from the axial-side supplementary gas supply part 33 increases, the film thickness on the axial side increases. When the flow rate of the source gas from the axial-side supplementary gas supply part 32 was set at 10 sccm (graph D), the film thickness was the same as the example of setting the flow rate of the source gas from the source gas supply part 32 at 50 sccm (graph A) that was ten times as high as the flow rate of 5 sccm of the other example (graphs B through D). In other words, the film thickness deposited by supplying the source gas of a total flow rate of 15 sccm containing a flow rate of 5 sccm from the source gas supply part 32 and a flow rate of 15 sccm from the axial-side supplementary gas supply part 33 was approximately the same as the film thickness deposited by supplying the source gas of 50 sccm that was more than three times as high as the flow rate of 15 sccm only from the source gas supply part 32, which indicated that the supply amount of the source gas was able to be significantly decreased.

FIG. 26B is a diagram showing average film thicknesses and uniformities in film thickness across a surface of a wafer. In FIG. 26B, figures above bar graphs indicate the average film thicknesses and figures in the bar graph indicate the uniformities in the film thickness across the surface of the wafer W. As shown in FIG. 26B, when the flow rate of the source gas from the source gas supply part 32 is 10 sccm and the flow rate of the source gas from the axial-side supplementary gas supply part 33 is 5 sccm, the uniformity of the film thickness across the surface of the wafer W is 5.5, which is the most preferable value and is better than 7.6 obtained by supplying the source gas at a flow rate of 50 sccm only from the source gas supply part 32. Thus, the working example 3 indicates that the film deposition apparatus according to the present embodiment can achieve the preferable uniformity across the surface of the wafer W by appropriately setting a type and a flow rate of the supplementary gas supplied from the axial-side supplementary gas supply part 33 and supplying a small amount of source gas.

Moreover, along with the result of the working example 1, the working example 3 indicates that the film thickness on the axial side can be reduced by supplying Ar gas from the axial-side supplementary gas supply part 33, and the film thickness on the axial side can be increased by supplying the source gas. In other words, the working example 3 indicates that the film thickness can be controlled in the deposition process by supplying the supplementary gas from the axial-side supplementary gas supply part 33 depending on the intended use.

Furthermore, because the film thickness can be efficiently and widely controlled by supplying the supplementary gas only from the axial-side supplementary gas supply part 33, a sufficient effect can be obtained even by providing only the axial-side supplementary gas supply part 33.

In addition, even though working examples of supplying only the source gas from the peripheral-side supplementary gas supply part 34 were no performed, from the results of FIGS. 26A and 26B, it is said that the film thickness on the peripheral side can be increased by supplying the source gas from the peripheral-side supplementary gas supply part 34.

Thus, the film deposition apparatus and the film deposition method according to the present embodiment can achieve film deposition with superior uniformity across the surface of the wafer W by supplying a small amount of source gas.

In other words, the film deposition apparatus and the film deposition method according to the present embodiment can achieve the uniformity of the source gas supply across the surface of the wafer W.

As discussed above, the film deposition apparatus and the film deposition method according to the present embodiments are not limited to a film deposition process for depositing an oxide film using a silicon-containing gas, but can be applied to a film deposition process for depositing a nitriding film using a silicon-containing gas and a film deposition process for depositing a nitriding film using a titanium-containing gas.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A film deposition method, comprising steps of:
   supplying a source gas to an entire surface of a substrate placed on a turntable provided in a process chamber in a source gas supply region provided in a part in a circumferential direction of the turntable, from a source gas supply hole array provided in a bottom plate of a showerhead provided above the turntable with a first distance from the turntable while rotating the turntable, the source gas supply hole array entirely covering a diameter of the substrate, the source gas being one of a silicon-containing gas and a titanium-containing gas; and
   supplying an axial-side supplementary gas toward part of the surface of the substrate on the axial side of the turntable in a radial direction of the turntable, for adjusting a film thickness on the substrate, the axial-side supplementary gas being supplied in the source gas supply region from an axial-side supplementary gas supply hole array provided in the bottom plate of the showerhead, the axial-side supplementary gas supply hole array being shorter than the source gas supply hole array in the radial direction of the turntable and is provided above the turntable with a second distance from the turntable while rotating the turntable, the second distance being longer than the first distance.

2. The film deposition method according to claim 1, further comprising:
   supplying an peripheral-side supplementary gas for adjusting the film thickness to the substrate in the source gas supply region from a peripheral-side supplementary gas supply unit provided in the vicinity of the source gas supply unit and above the turntable with a third distance from the turntable while rotating the turntable, the third distance being longer than or equal to the second distance, the peripheral-side supplementary gas supply unit supplying the peripheral-side supplementary gas to a predetermined region on the peripheral side of the turntable.

3. The film deposition method according to claim 2, wherein the steps of supplying the source gas, supplying the axial-side supplementary gas and supplying the peripheral-side supplementary gas are performed simultaneously and continuously.

4. The film deposition method according to claim 2, wherein the step of supplying the source gas comprises supplying a silicon containing gas as the source gas, and
   wherein the steps of supplying the axial-side supplementary gas and supplying the peripheral-side complementary gas comprise supplying a gas containing an inert gas as the axial-side supplementary gas and the peripheral-side complementary gas.

5. The film deposition method according to claim 2, wherein the steps of supplying the axial-side supplementary gas and supplying the peripheral-side complementary gas decrease a concentration of the source gas by supplying the axial-side supplementary gas and the peripheral-side supplementary gas.

6. The film deposition method according to claim 2, wherein the source gas supply unit, the axial-side supplementary gas supply unit and the peripheral-side gas supply unit are integrally configured as a showerhead, and
   wherein the source gas, the axial-side supplementary gas and the peripheral-side supplementary gas are supplied from a bottom surface of the showerhead.

7. The film deposition method according to claim 1, wherein the source gas is supplied at a flow rate of 30 sccm or less.

* * * * *